(12) United States Patent
Hamid et al.

(10) Patent No.: US 9,652,564 B2
(45) Date of Patent: May 16, 2017

(54) WELL TOOL SCALE BUILDUP TEST, MODEL AND MITIGATION

(71) Applicant: HALLIBURTON ENERGY SERVICES, INC., Houston, TX (US)

(72) Inventors: Syed Hamid, Dallas, TX (US); Christopher L. Edwards, Pampa, TX (US); Juanita M. Cassidy, Duncan, OK (US); Pete Dagenais, The Colony, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/758,083

(22) PCT Filed: Apr. 12, 2013

(86) PCT No.: PCT/US2013/036429
§ 371 (c)(1),
(2) Date: Jun. 26, 2015

(87) PCT Pub. No.: WO2014/168632
PCT Pub. Date: Oct. 16, 2014

(65) Prior Publication Data
US 2015/0356210 A1 Dec. 10, 2015

(51) Int. Cl.
*G06G 7/48* (2006.01)
*G06F 17/50* (2006.01)
(Continued)

(52) U.S. Cl.
CPC ............. *G06F 17/50* (2013.01); *E21B 34/00* (2013.01); *E21B 37/00* (2013.01); *G06F 17/10* (2013.01); *E21B 2034/007* (2013.01)

(58) Field of Classification Search
CPC ..................................................... E21B 37/00
(Continued)

(56) References Cited

U.S. PATENT DOCUMENTS

2005/0217856 A1 10/2005 Chen et al.
2008/0053204 A1 3/2008 Neville et al.
(Continued)

OTHER PUBLICATIONS

Ebenezer: Tracer Behaviour in Pipelines with Deposits and Analysis of Natural Gas Pressure Functions; NTNU Diploma Thesis Work; Tronheim, 2006; 69 pp.*
(Continued)

*Primary Examiner* — Hugh Jones
(74) *Attorney, Agent, or Firm* — John W. Wustenberg; Tumey L.L.P.

(57) ABSTRACT

Testing scale buildup in a well tool can include pressurizing separate cationic and anionic solutions, then heating the separate solutions, mixing together the solutions, and exposing the well tool to the mixed solutions. A well tool can be constructed by a) determining velocities of flow at a predetermined offset from surfaces of a geometric model representative of the well tool, b) calculating scale buildup on the surfaces based at least in part on the velocities, c) reducing pressure change per unit distance along selected ones of the surfaces having greater than a predetermined level of scale buildup, and d) repeating steps a-c until all scale buildup is no greater than the predetermined level. A method of predicting scale buildup can include inputting a parameter indicative of flow through a well tool to a mathematical model, which determines a rate of scale buildup on a surface of the well tool.

11 Claims, 35 Drawing Sheets

(51) Int. Cl.
*G06F 17/10* (2006.01)
*E21B 34/00* (2006.01)
*E21B 37/00* (2006.01)

(58) Field of Classification Search
USPC .......................................................... 703/10
See application file for complete search history.

(56) References Cited

U.S. PATENT DOCUMENTS

| 2008/0280789 A1 | 11/2008 | Welton et al. |
| 2009/0090556 A1 | 4/2009 | Chen |
| 2010/0230109 A1 | 9/2010 | Lake et al. |

OTHER PUBLICATIONS

Search Report and Written Opinion issued Jan. 7, 2014 for International Application PCT/US13/36429, 10 pages.

* cited by examiner

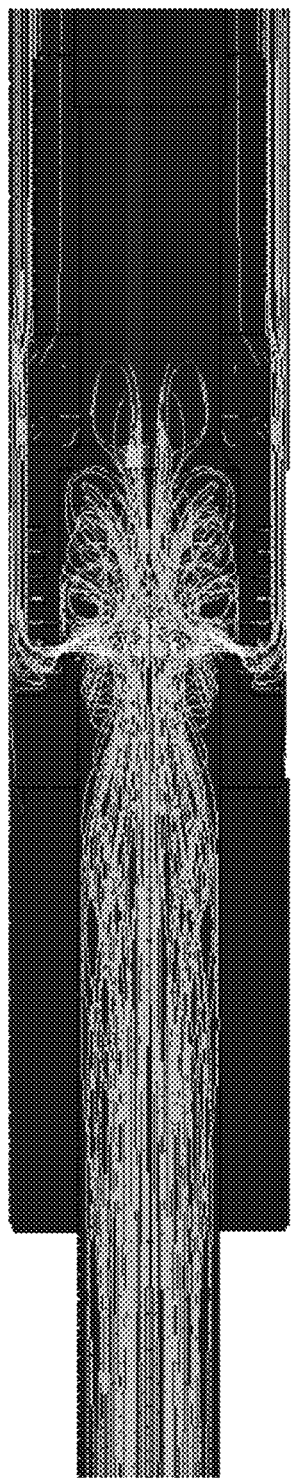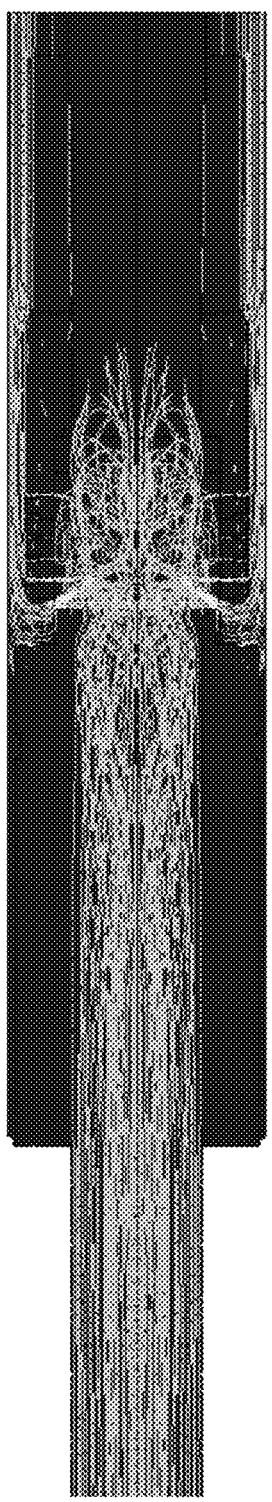
FIG.9A
FIG.9B

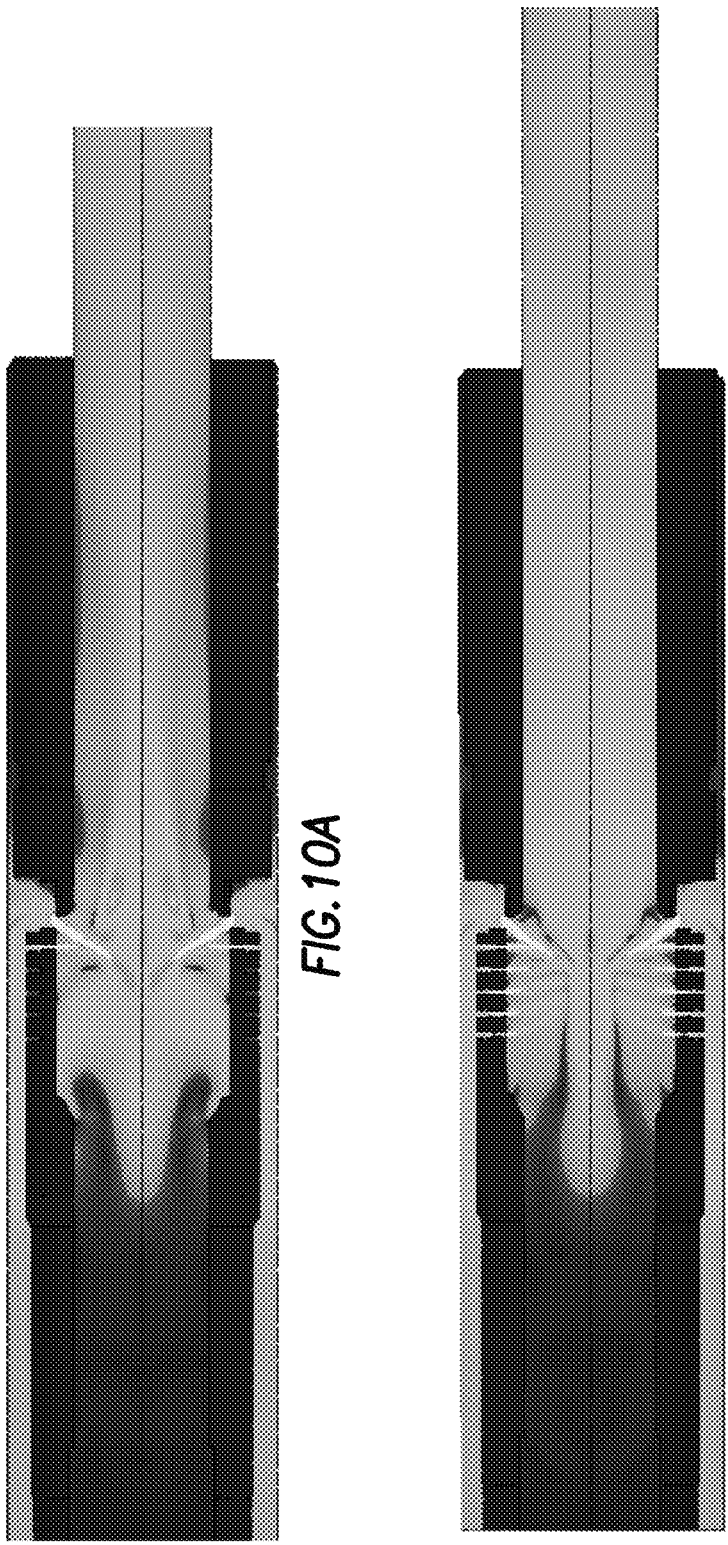

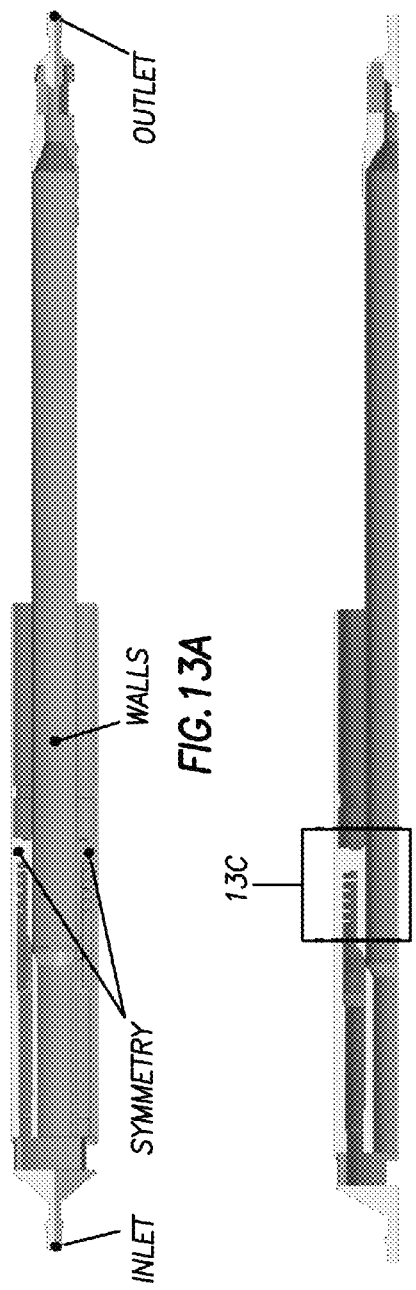
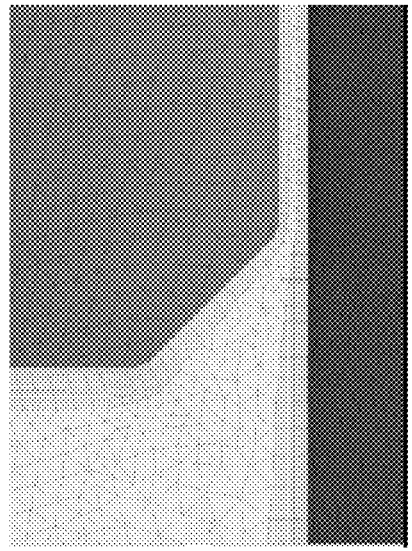
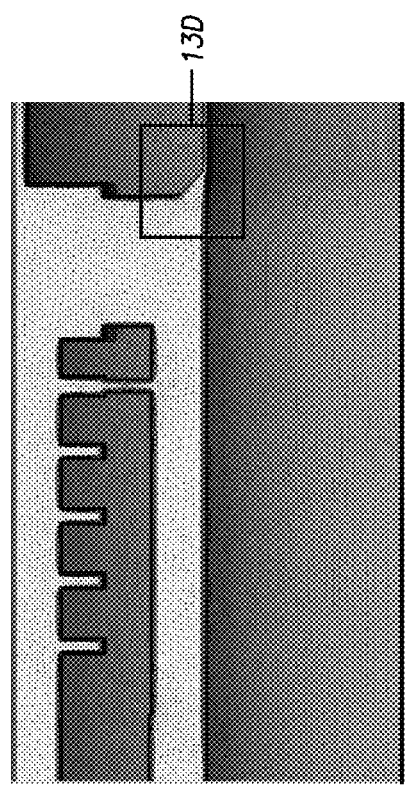
FIG. 13A
FIG. 13B
FIG. 13C
FIG. 13D

WELL TOOL SCALE BUILDUP TEST, MODEL AND MITIGATION

TECHNICAL FIELD

This disclosure relates generally to equipment utilized and operations performed in conjunction with a subterranean well and, in one example described below, more particularly provides for testing, modeling and mitigating scale buildup in well tools.

BACKGROUND

It will be appreciated by those skilled in the art that inorganic scale formation associated with brine solutions produced from oil and gas wells has been a major issue, leading to production restrictions and costly downtime to remove the scale. In the past few decades there have been a significant number of studies to understand the mechanism of scaling at elevated temperatures and pressures, which correspond to well operating conditions, and developing models to predict the change in scaling conditions over the life cycle of the oil and gas wells.

Stiff and Davis studied the tendency of $CaCO_3$ scaling of oil field waters (1). Oddo and Tomson derived a simplified method of calculating $CaCO_3$ saturation at high temperatures and pressures (2). Oddo and Tomson also investigated and introduced new saturation indices for barium, strontium, magnesium and calcium sulfates and calcium carbonates (3). Haaberg, Selm and Granbakken investigated scale formation in reservoir and production equipment during oil recovery by presenting a reliable model for the solubility products of scale-forming minerals (4). Straub investigated solubility of $CaSO_4$ and $CaCO_3$ at temperatures between 182° C. to 316° C. (5). It was concluded that $CaSO_4$ and $CaCO_3$ solubility decreases with increasing temperature (5). Yeboah, Somauh, and, Saeed presented a new reliable model for predicting oilfield scale formation (6). This model, in contrast to other models which predict only scaling potential using thermodynamics and limited solubility data, predicts the potential and deposition profile based on extensive thermodynamic and kinetic data.

There are numerous models available in the literature (Ref. 1) which address the scale formation potential through solubility index computations. These models are primarily based on stoichiometry of the brine and do not adequately address the reaction rate. Also, a majority of the research has been performed by academia which is somewhat limited to low flow rate and relatively low pressure conditions. The tube tests conducted by flowing a brine solution through a capillary tube at high temperature (and low pressures on the order of a few hundred psi) are effectively utilized for inhibitor comparisons.

These are not suitable for predicting scale growth for more complex geometry, such as that of an interval control valve of the type used to regulate fluid flow into a tubular string. There also appears to be a shortage of mechanical strength data for the scale materials formed over a range of temperatures and pressures commonly encountered in a well downhole.

BRIEF DESCRIPTION OF THE DRAWINGS

FIGS. 9A & B are representative plots of flow streamlines when brine is flowed through the well tool when it is at a partially open position.

FIGS. 10A & B are representative plots of fluid velocity field in the well tool.

FIGS. 13A-D are representative cross-sectional views of a fluid domain of a Computational Fluid Dynamics™ model.

DETAILED DESCRIPTION

Figure 1:
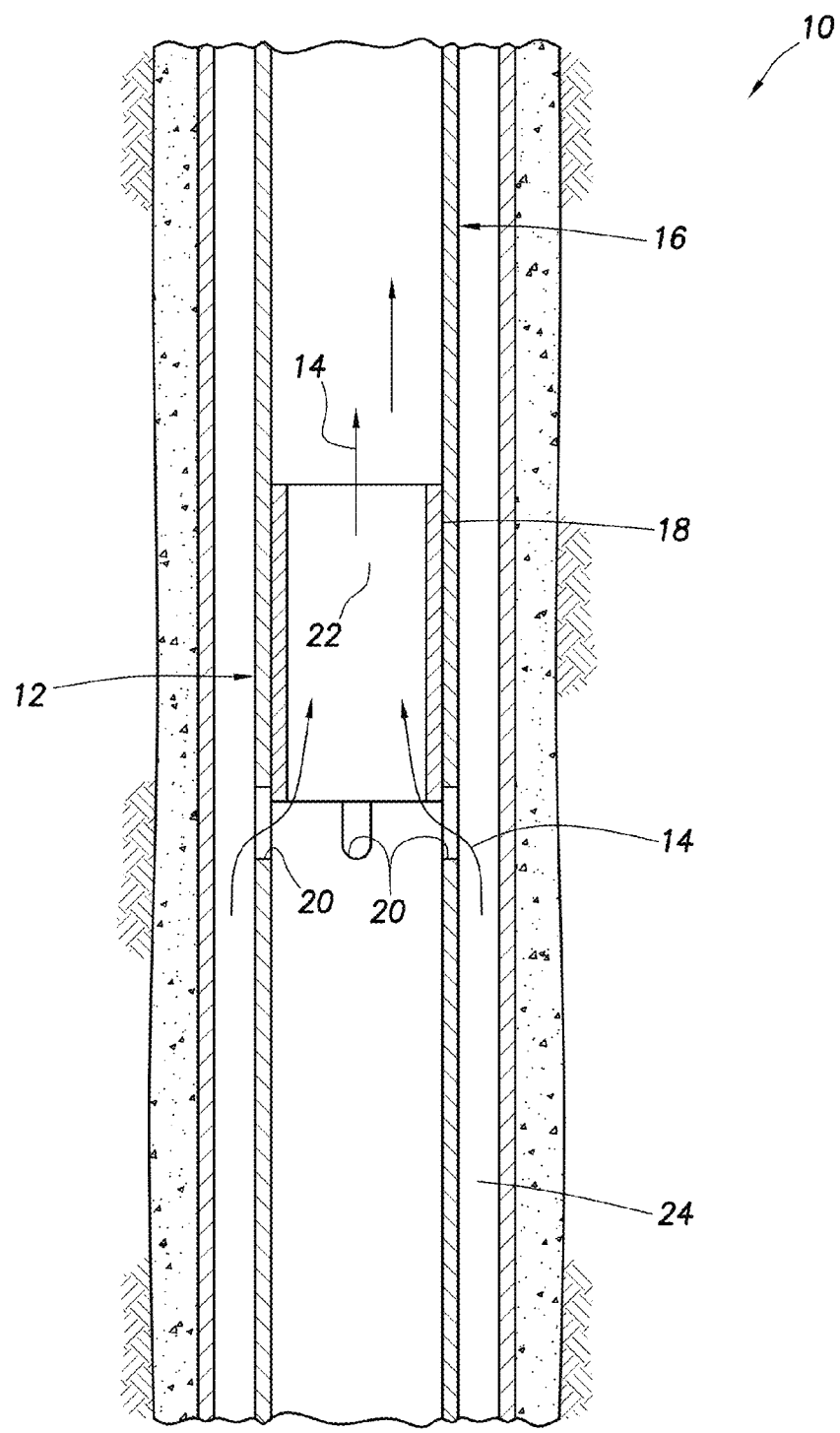
FIG. 1 is a representative partially cross-sectional view of a well system and associated method which can benefit from the principles of this disclosure.

Representatively illustrated in FIG. 1 is a well system 10 and associated method which can benefit from the principles of this disclosure. However, it should be clearly understood that the system 10 and method are merely one example of an application of the principles of this disclosure in practice, and a wide variety of other examples are possible. Therefore, the scope of this disclosure is not limited at all to the details of the system 10 and method described herein and/or depicted in the drawings.

In the FIG. 1 example, a well tool 12 (such as, a remotely or locally operable valve or choke) is used to control flow of well fluid 14 into a tubular string 16. The well tool 12 includes a sliding sleeve 18 which displaces relative to ports 20, in order to regulate flow of the fluid 14 through the ports.

However, it should be clearly understood that the well tool 12 is merely one example of a wide variety of different types of well tools that can benefit from the principles described herein. Other types of well tools that can utilize the principles of this disclosure include packers, screens, nipples, other types of completion equipment, etc. Thus, the scope of this disclosure is not limited to any particular type of well tool.

In the FIG. 1 example, the well fluid 14 comprises hydrocarbon fluids and a brine solution that will tend to form scale on the well tool 12. If buildup of the scale is excessive, the well tool 12 may become inoperative (e.g., so that it can no longer regulate flow into the tubular string 16), and the well tool can even become plugged by the scale buildup (e.g., so that the fluid 14 can no longer flow through the ports 20, or through an internal longitudinal flow passage 22).

It would be beneficial to be able to predict the scale buildup on the well tool 12, so that a useful life of the well tool in the well can be determined, prior to installing the well tool in the well. Expected downhole conditions (pressure, temperature, composition of the well fluid 14, flow rate of the fluid through the well tool 12, etc.) could be used to predict the scale buildup.

It would also be beneficial to be able to modify a geometric design of the well tool 12, so that scale buildup is reduced. In this manner, scale buildup on the well tool 12 could be minimized, so that the well tool will have a longer useful life in the well.

Furthermore, it would be beneficial to be able to test the scale buildup on the well tool 12 at downhole conditions. In this manner, a suitability of the well tool 12 for use in those downhole conditions can be verified, prior to installing the well tool in the well.

Figure 2:
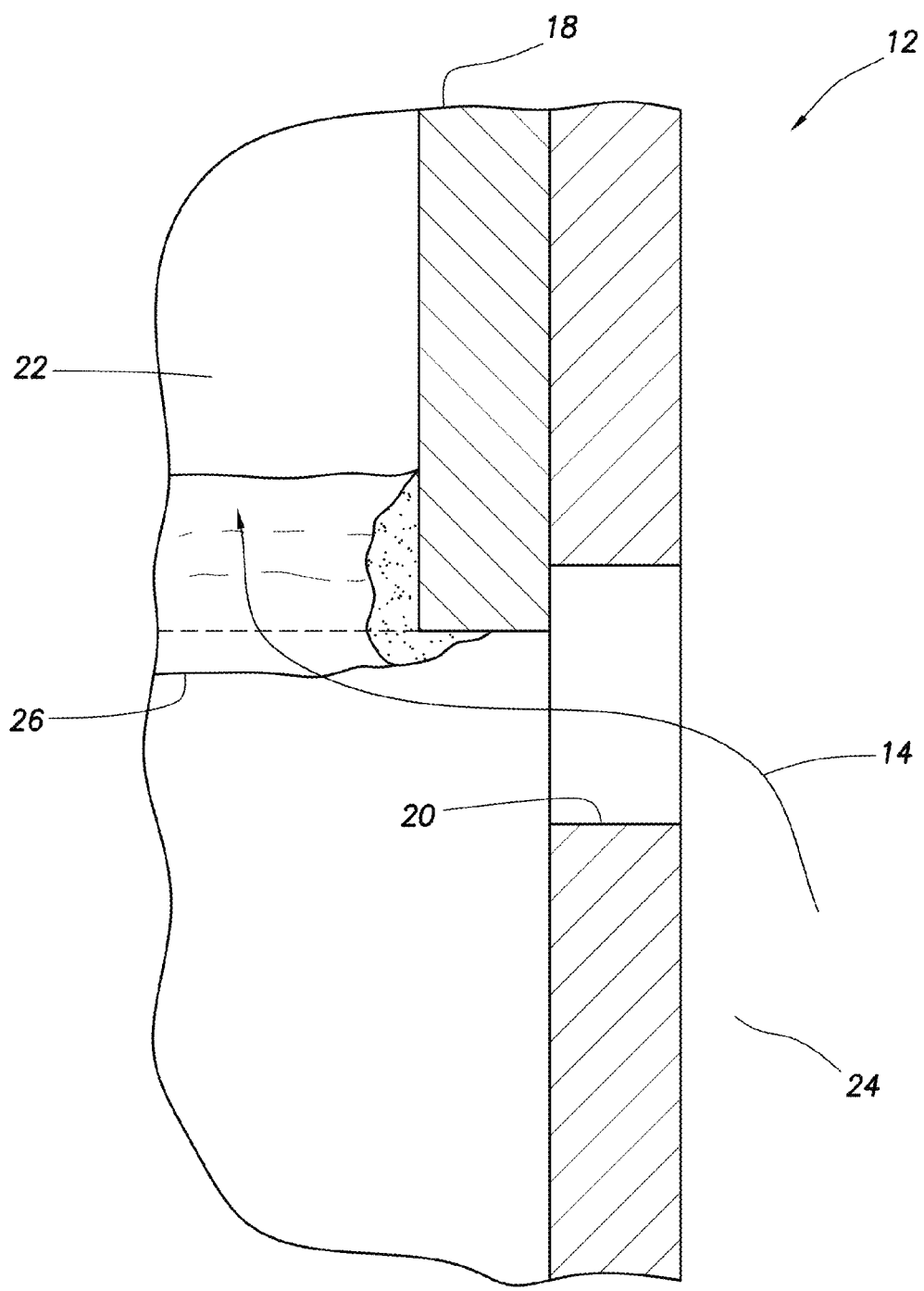
FIG. 2 is an enlarged scale representative cross-sectional view of a portion of a well tool which may be used in the system and method of FIG. 1.

Referring additionally now to FIG. 2, an enlarged scale cross-sectional view of a portion of the well tool 12 is representatively illustrated. In this view, it may be more clearly seen that the fluid 14 passes through a series of different regions as it flows from an annulus 24 external to the well tool 12, through the ports 20, into the flow passage 22, and then into a reduced diameter section of the flow passage.

It will be appreciated that, due to there being different flow areas and orientations of these different regions, the fluid 14 will have different velocities as it flows through the different regions. In addition, due at least in part to the Bernoulli principle, pressure in the fluid 14 will also vary as it flows through the different regions.

As depicted in FIG. 2, scale buildup 26 has occurred in the well tool 12 at a transition from a larger diameter to a smaller diameter portion of the flow passage 22. If such scale buildup 26 continues, the sliding sleeve 18 may become inoperative, and/or the scale buildup may plug the flow passage 22 or the ports 20.

Of course, the scale buildup 26 can occur in other portions of the well tool 12 (such as, at a transition from the annulus 24 to the ports 20, at a transition from the ports to the flow passage 22, etc.). The scope of this disclosure is not limited to scale buildup being formed in any particular portion of a well tool.

Figure 3:
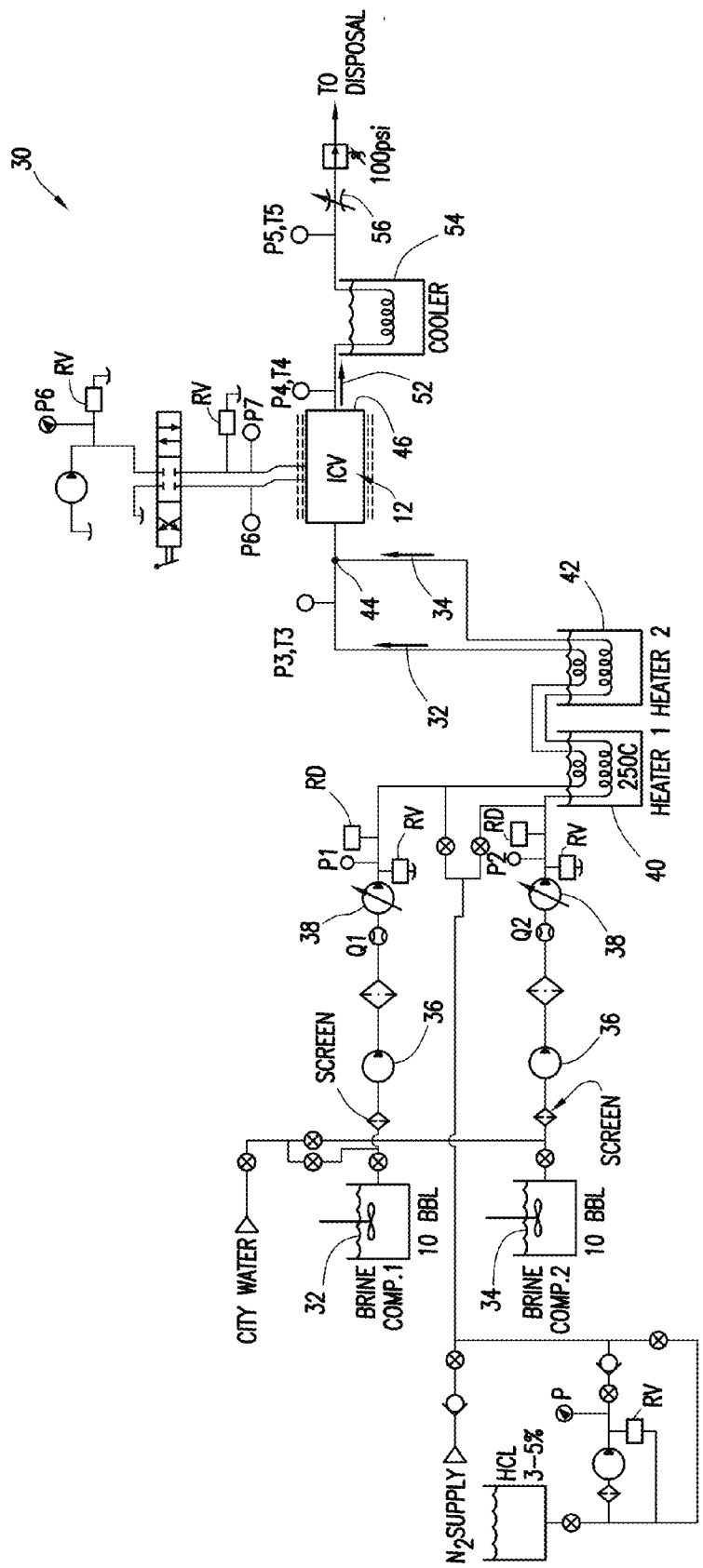
FIG. 3 is a representative schematic of a test setup for testing scale buildup rate on the well tool at downhole conditions.

In order to test the well tool 12 at downhole conditions, to determine where and how much the scale buildup 26 progresses, a test setup 30 and associated method as representatively and schematically illustrated in FIG. 3 may be used. The test method uniquely enables well conditions to be simulated, so that the scale buildup 26 in the well tool 12 can be accurately produced and preserved for post-test analysis.

In one unique feature of the test method, separate cationic and anionic solutions 32, 34 are prepared. The cationic and anionic solutions 32, 34 together make up a portion of the well fluid 14 from which the scale buildup 26 is formed.

For example, the well fluid 14 could comprise a brine with cationic and anionic solution components. By separately preparing the cationic and anionic solutions 32, 34 and separately pressurizing and heating the solutions to expected well conditions prior to mixing the solutions, premature formation of scale can be avoided.

The cationic and anionic solutions 32, 34 are pressurized by means of separate sets of booster and high pressure pumps 36, 38. The high pressure pumps 38 preferably elevate the pressures of the cationic and anionic solutions 32, 34 to expected downhole pressure.

The cationic and anionic solutions 32, 34 are then heated to expected downhole temperature using, for example, one more heat exchangers 40, 42. Note that, the separation of the cationic and anionic solutions 32, 34 is maintained during this heating stage.

After heating, the cationic and anionic solutions 43, 34 are mixed at a junction 44 just prior to being flowed through the well tool 12. In this example, the well tool 12 is preferably positioned in a chamber 46 heated to expected well temperature using a heater 48. An actuation system 50 may be provided to operate the well tool 12 during testing.

After flowing through the well tool 12, heat is removed from the mixture 52 by a heat exchanger 54. After cooling, the mixture 52 is depressurized by flowing through a flow control device 56 (such as a choke, etc.). It is beneficial to reduce the temperature and pressure of the mixture 54 at this point in the process, so that previously formed scale (e.g., in or on the well tool 12) will not go into solution. In this manner, the scale buildup 26 is preserved for later measurement and analysis.

Nitrogen may be used to quickly purge the cationic and anionic solutions 32, 34 and their mixture 52 from the chamber 46 and various lines after the test. Acid can be used to clean the lines and chamber 46.

Figure 4:
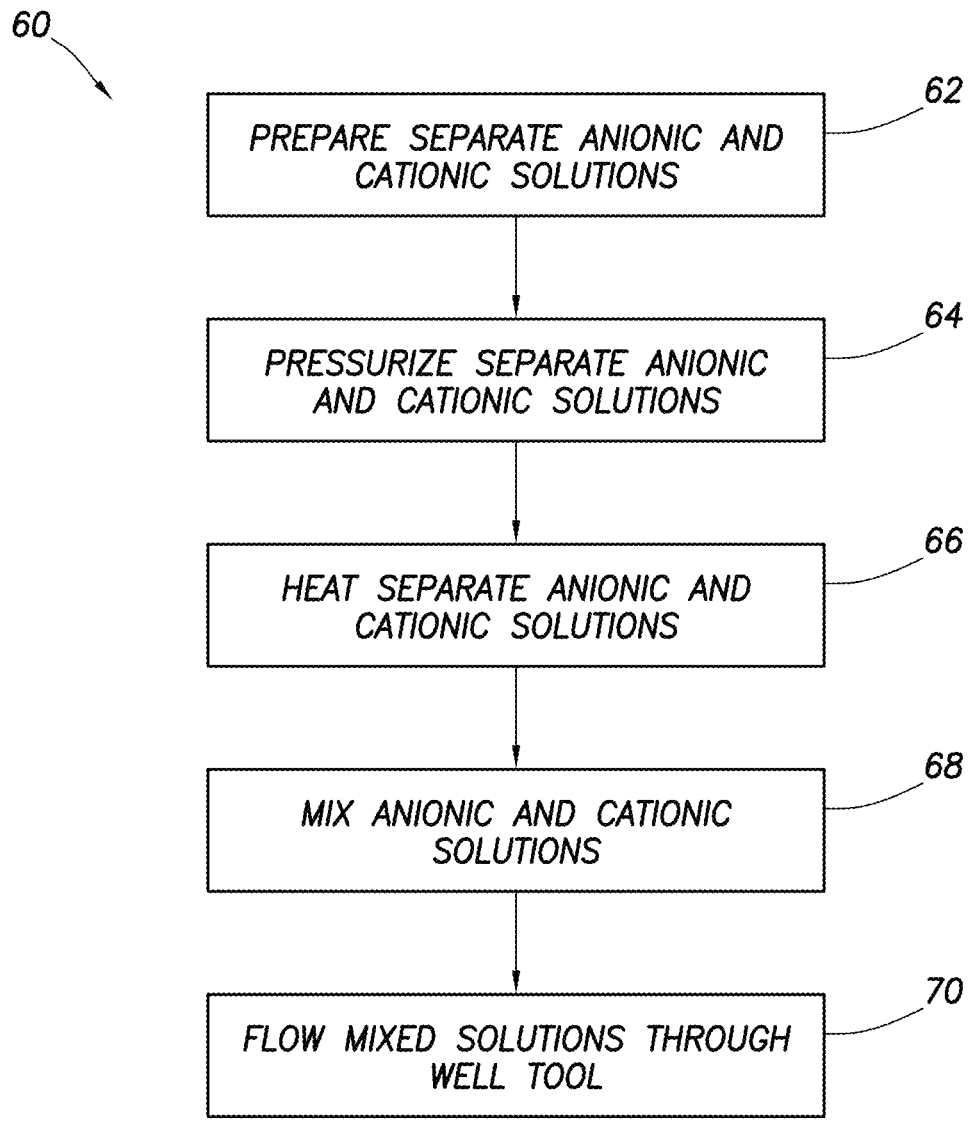
FIG. 4 is a representative flowchart for a method of testing scale buildup.

Referring additionally now to FIG. 4, a flowchart for a test method 60 is representatively illustrated. This method 60 may be the one described above for use with the test setup 30, or it may be used with other test setups, equipment, well tools, etc.

In step 62, separate cationic and anionic solutions 32, 34 are prepared. The solutions 32, 34 are prepared so that, upon mixing, their mixture 52 will simulate the well fluid 14, or a portion thereof responsible for the scale buildup 26.

In step 64, the solutions 32, 34 are separately pressurized. In the above example, the pumps 36, 38 are used for this purpose.

In step 66, the solutions 32, 34 are separately heated. The heat exchangers 40, 42 may be used for this purpose.

In step 68, the solutions 32, 34 are mixed, forming the mixture 52. This mixture 52 is preferably substantially the same as the well fluid 14, or a portion thereof responsible for the scale buildup 26.

In step 70, the mixture 52 is flowed through the well tool 12. Depending on the type of well tool, the mixture 52 may be flowed internally and/or externally through or about the well tool. The well tool surfaces are, thus, exposed to the mixture 52 at downhole conditions.

After the test, the well tool 12 can be examined to determine how much scale buildup 26 has occurred, and on which surfaces. This information can be useful for many purposes, one of which is to decide whether the well tool 12 geometric design is suitable for a given set of downhole conditions.

Another use for the information gleaned from the test is in developing a mathematical model to predict the scale buildup 26 on the well tool 12. For example, empirical test data can be input to a neural network. This test data can include temperature, pressure, flow rate, concentration of various constituents of the cationic and anionic solutions 32, 34, geometry of the well tool 12, etc.

When the neural network is sufficiently trained, it will be able to predict the scale buildup 26 on surfaces of a given well tool geometry at expected downhole conditions. This information may be used to determine whether the well tool 12 is suitable for use in the downhole conditions, and for modifying the well tool geometry, if needed, so that it is suitable for the downhole conditions.

Figure 5:
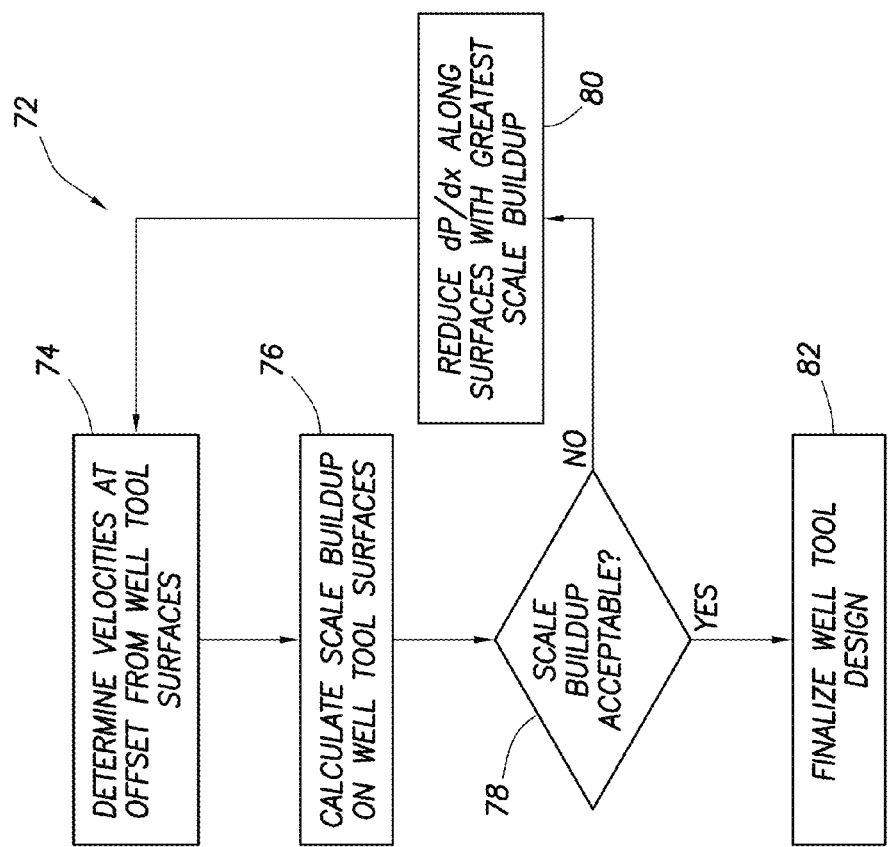
FIG. 5 is a representative flowchart for a method of constructing a well tool.

An example of a method 72 for constructing the well tool 12 is representatively illustrated in flowchart form in FIG. 5. The method 72 may be used as an aid in designing the well tool 12, or any other type of well tool. A computing system 100, which may be used in performing the method 72, is representatively illustrated in FIG. 38.

In step 74 of FIG. 5, a proposed well tool geometry and the expected downhole conditions are used to determine velocities of the well fluid 14 at a predetermined offset from surfaces of the well tool 12. For example, a geometrical model of at least a portion of the proposed well tool 12 design, along with expected downhole conditions, can be input to a commercially available software program, such as Computational Fluid Dynamics or CFD™/CFX™ available from ANSYS, Inc. of Canonsburg, Pa. USA.

The software program may be stored as instructions 102 in memory 104 of the computing system 100. The proposed well tool geometry and expected downhole conditions may be stored as data 106 in the computing system memory 104.

The software program (executed by a processor 108 of the computing system 100) can calculate velocities of the fluid 14 at the predetermined offset (e.g., 0.0002 in or 0.005 mm) from the well tool 12 surfaces. One advantage of calculating the velocities at the predetermined offset is that the velocities are representative of conditions in a boundary layer between the fluid 14 and the surfaces where scale bonding occurs, rather than at the surface (where fluid velocities diminish toward zero) or removed from the boundary layer. However, the scope of this disclosure is not limited to calculation of velocities at any particular offset from the well tool 12 surfaces.

In step 76, the scale buildup 26 on the well tool 12 surfaces is calculated (for example, by the processor 108). The mathematical model described above may be used for this calculation. The velocities determined in step 74, as well as another parameter dP/dx (change in pressure per unit distance along a well tool surface, which can also be calculated by the Computational Fluid Dynamics program), are influential to the results of the step 76 calculation.

In step 78, a determination is made as to whether the calculated scale buildup 26 on the well tool 12 surfaces is acceptable. If the scale buildup 26 is excessive (e.g., greater than a predetermined level of maximum acceptable scale buildup), then in step 80, the parameter dP/dx can be reduced, and then steps 74-78 can be repeated to determine if the scale buildup 26 becomes acceptable. Steps 74-80 can be repeated as many times as needed to modify the well tool design so that the scale buildup 26 is no greater than the maximum acceptable level of scale buildup.

The predetermined level of maximum acceptable scale buildup can be input to the computing system 100 via an input device 110 (such as, a keyboard, a touch-sensitive display, another type of data input device, etc.) of a user interface 112 of the computing system. The calculated scale buildup 26, and/or the determination of whether the scale buildup is acceptable, may be output to a user via a display device 114 (such as, a graphical display, a printout, an audible or visual alert, etc.).

Note that reducing the parameter dP/dx for a surface of the well tool 12 will generally involve modifying the geometric model for the well tool. For example, in the well tool 12 design of FIG. 2, an abrupt change in diameter occurs at the transition between the larger and reduced diameters of the flow passage 22. This results in a large dP/dx at this transition, and unacceptable scale buildup 26 can be caused in part by this large dP/dx.

The parameter dP/dx can be reduced at this transition by providing a long internal taper at the lower end of the sleeve 18, thereby gradually changing the flow passage 22 diameter at this location. Such a change can be made to the geometrical model of the well tool 12 (for example, using the user interface 112 to change the geometrical model stored in the memory 104), and steps 74-78 can be repeated to see if the scale buildup 26 is thereby reduced sufficiently, so that it is acceptable. Of course, other surfaces of the well tool 12 may be modified in this process, as well.

Once the scale buildup 26 on all of the well tool 12 surfaces is determined to be acceptable (or acceptably improved) in step 78, the well tool design can be finalized. Using the refined geometric model of the well tool 12, the well tool can be constructed and installed in the well, with an expectation that the scale buildup on the well tool in actual service will not be unacceptable, or will at least be acceptably improved.

Figure 6:
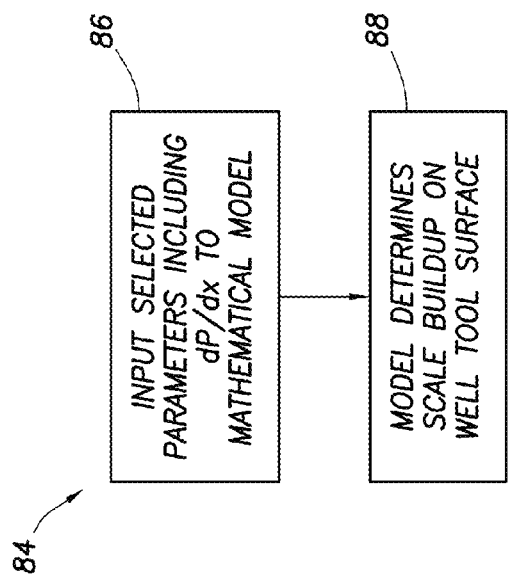
FIG. 6 is a representative flow chart for a method of using a model to determine scale buildup on a well tool surface.

The method 72 utilizes the mathematical model to enable refining of the well tool 12 geometry. Representatively illustrated in FIG. 6 is a method 84 of predicting scale buildup on a well tool 12, which method can utilize the mathematical model. The computing system 100 of FIG. 38 may also be used with the method 84 of FIG. 6.

In step 86, certain parameters (including dP/dx, velocities at an offset from a well tool surface, etc.) are input to the mathematical model. The model then determines scale buildup 26 on the well tool surface. As discussed above, the mathematical model can comprise a neural network, although other types of mathematical models may be used, if desired.

To investigate scaling on a full size actual well tool 12, conditions were set in the laboratory to induce rapid scaling for mechanical testing purposes. However, the rapid formation of scale may directly affect its mechanical properties.

Utilizing the test setup 30 of FIG. 3, eight scaling tests were carried out for 2 concentrations, time required to create scale (varied from 20 minutes to 3.5 hours for different tests) at 10,000 psi (or 7000 psi) at 150° C. (or 75° C.) at 1 gallon/min flow rate of brine. (The low flow rate was selected to keep the testing costs to an acceptable level.) A number of tests covering a range of desired pressures, temperatures, brine concentrations and valve openings were conducted for suitable durations ranging from hours to days.

Fluid was pumped into an inlet sleeve simulating a wellbore. Note the housing of the valve was slightly modified on the OD to accommodate the inlet sleeve, however, this did not alter the internal geometry of the valve. Fluid was flowed through the valve in the production direction.

FIG. 3 shows a schematic of the test system used to conduct scaling simulation tests on the full size well tool. In this example, the test setup 30 consists of two high pressure (10,000 psi working pressure) pumps 38 with a maximum flow rate capacity of 1 gpm each. These pumps 38 are pressurized by two booster pumps 36.

Screens and filters are used on the suction sides of the pumps 36, 38 to keep the solids from entering the system. Two 10 barrel capacity stainless steel tanks were utilized to hold the two solutions 32, 34 comprising the brine.

An example brine included (but was not limited to) $Na_2SO_4$, $NaHCO_3$, Acetic Acid ($CH_3COOH$), $CaCl_2.2H_2O$, $MgCl_2.6H_2O$, NaCl, and Water. The brine composition was divided into separate anionic and cationic solutions, with the cationic solution comprising (but not limited to) $CaCl_2.2H_2O$, $MgCl_2.6H_2O$, NaCl and Water, and the anionic solution comprising (but not limited to) $Na_2SO_4$, $NaHCO_3$, Acetic Acid ($CH_3COOH$) and Water. Note the total amount of water used was divided between the two solutions to result in equal volumes.

Tap water from Duncan, a city in Oklahoma, USA, was used to prepare the brine solutions. Chemical composition of the Duncan tap water was accounted for in the brine solutions preparation by applying corrections to the chemicals.

The brine solution tanks are equipped with pneumatically driven stirrers to keep the chemicals in suspension throughout the test. The discharge fluids from the two pumps 36, 38 are routed through coil heaters 40, 42 to raise the solution 1 and solution 2 temperatures to the desired test temperature. The chamber 46 is also heated with heater tape to keep it at the same temperature as the incoming fluid 52. In addition, the chamber 46 is also thermally insulated to maintain a uniform temperature. This is to simulate the downhole conditions closely.

Fluid 52 from the chamber 46 is routed through a cooler 54 to bring the spent brine temperature down to near room temperature. Fluid 52 then passes through a needle valve or other flow control device 56 to provide back pressure to maintain the high ambient pressures (7,000 and 10,000 psi) for the flow tests.

A hydraulic actuation system 50 is also connected to the well tool 12. The actuation system 50 consisted of a hydraulic pump and on/off valves to route hydraulic fluid to one port or the other to advance or retract a piston to close or open the well tool 12. With the hydraulic pump, the piston could be advanced in small increments.

Pressures, temperatures and flow rates were measured at various locations as identified in FIG. 3. Two heating baths 40, 42 were used due to a high rate of thermal loss from one of the underground baths that was originally selected for heating the brine solutions. The speed of the two pumps 36, 38 was correlated with flowmeter readings and was recorded.

Figure 7:
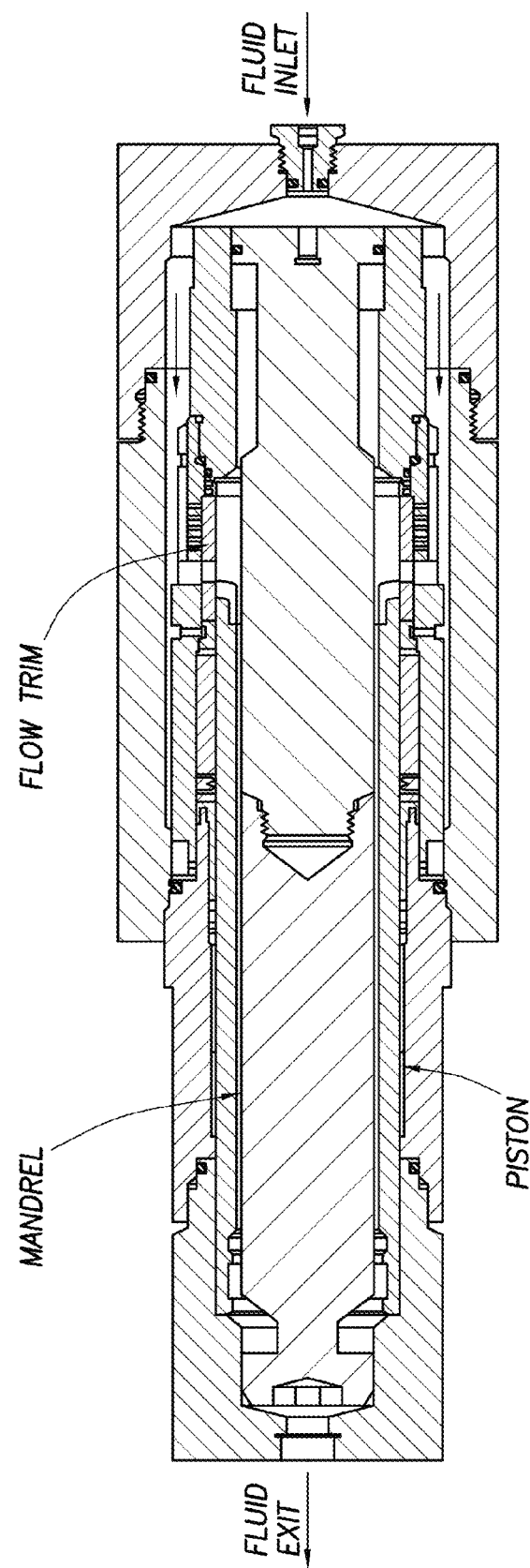
FIG. 7 is a representative cross-sectional view of the well tool in a test fixture in the test setup of FIG. 3.
Figure 8:
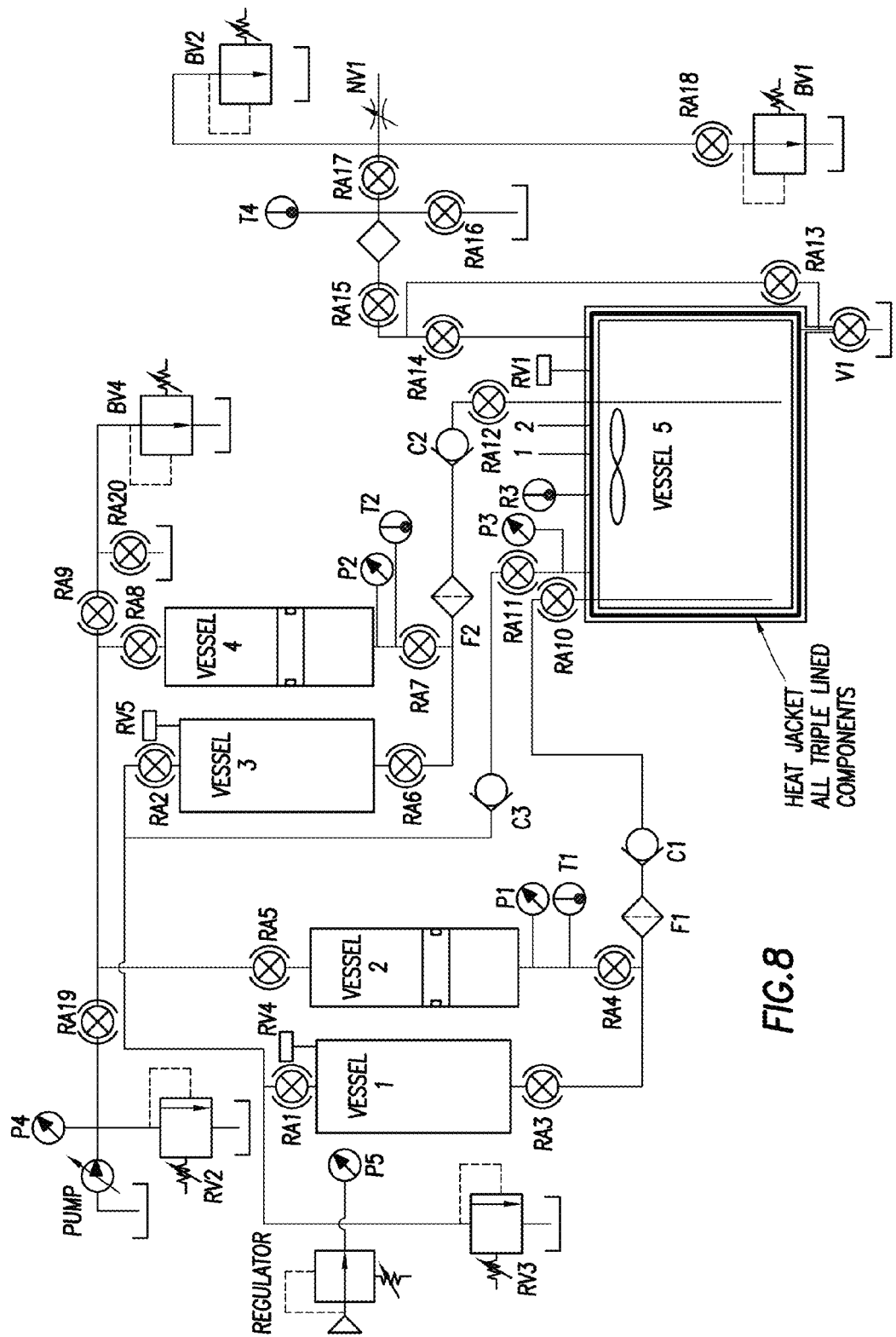
FIG. 8 is a representative schematic of a test setup for testing scale buildup on coupons at downhole conditions.

FIG. 7 shows a cross-section view of the full size well tool test fixture. The fluid inlet is on the right and the exit on the left as shown. The figure also shows the flow path in the well tool through the flow trim. It should be noted that the cross section in FIG. 7 shows 6 ports (5 relatively small and one large port) at the top and 6 at the bottom making it symmetric. However, in a plane at right angles to this plane, there are only 2 ports (1 small and one large) at the top and 2 ports at the bottom. This creates a 3-dimensional flow field.

Testing Procedure

The testing procedure for the well tool scaling tests evolved over the course of the tests based on the experience gained.

Typical Test Specifications:
T=250 F P=8,000 psi Concentration=80%
Valve Opening: 40% open for 24 hours
Test Procedure:
1. Collect brine samples at the inlet and outlet of the system every 2 hours. Mark them with test #1 and time and date.
2. Mark Top and Bottom positions of the well tool for orientation purposes.
3. Take photos of the set up.
4. Start heating well tool to 250 F. Note well tool is disconnected from the system at this time, and a Substitute tubing is in place.
5. Set nitrogen regulator pressure to 500 psi. Keep the nitrogen valve closed.
6. Set CPT (i.e. heating Bath 1) to 300 F and Bath 2 to 300 F.
7. Turn off suction side heaters.
8. Pump city water through the system (with Substitute tubing in the system) at required flow rate and 1,000 psi pump pressure.
9. Adjust temperatures in the CPT and Bath 2 to get 250 F water temperature at inlet to the well tool.
10. Adjust cooler water flow rate to get the exit temperature of the water to less than 100 F.
11. Set back pressure valve to 500 psi while flowing at desired flow rate.
12. When stable temperatures are reached, stop pumping and replace Substitute tubing with well tool in the system.
13. Actuate well tool to get 40% open position.
14. After reaching 40% open position, start pumping brine at 250 F inlet temperature and 8,000 psi pressure.
15. Pump for 24 hours, monitoring all system parameters closely.
16. Upon completion of a total of 24 hours of pumping, lower pump pressure to 500 psi by reducing flow rates.
17. Open nitrogen valve to pressurize the system with nitrogen.
18. Slowly lower the flow rates of the two pumps bringing them finally to a stop together.
19. Increase the nitrogen pressure as needed to displace the brine in the system, making sure not to exceed the exit temperature above 150 F.
20. When all the brine has been displaced in the system, turn off the nitrogen and allow the system to cool.
21. End of the test.

Well Tool Specimen Preparation:

After each test, the well tool components were disassembled (with the exception of the actuator assembly) and cleaned for the next test. The brine wetted parts were cleaned with 3% HCl solution. Standard thread lubricant was used to assemble the threaded parts. No other mechanical cleaning was performed, so the parts should not have any unusual change in their scaling tendencies.

Test Results

Results of the well tool tests consist of pressure, temperature and flow rate plots of the tests carried out, along with the scale thickness measured in various locations in the tool.

CFD™ Simulations

This section describes results of the CFD™ simulations performed for three different valve openings, while flowing at a full production rate at well pressure and temperature through a 4.5 inch valve with original inlet and outlet geometry.

In addition to the well tool simulations, the reactor vessel simulations are also included in this section, however they do not correspond to expected downhole conditions.

Due to the geometry of the well tool, only a quarter model was run for the CFD™ simulations to minimize the model size and hence the computational resources. The half section results shown below are obtained by reflecting the quarter model about the valve axis.

FIGS. 9A & B show the flow streamlines when brine is flowed at the production flow rate through the well tool when it is at 30% open position.

The views in FIGS. 9A & B correspond to the two azimuthal positions of the flow trim of the well tool which are 180 degrees apart. The FIG. 9A view shows a large port and one small port each on both sides (i.e. 0° and 180°) of the flow trim, and similarly the FIG. 9B view shows one large port and one small port each on both sides (i.e. 90° and 270°) of the flow trim. The high velocity points and the reverse flow in the well tool can be clearly seen in FIGS. 9A & B.

FIGS. 10A & B show the actual velocity field in the valve. The three dimensional nature of the flow field is quite apparent thereby precluding an axisymmetric rendition of the CFD™ model. The maximum fluid velocity seems to occur in the vicinity of the ports.

Figure 11:
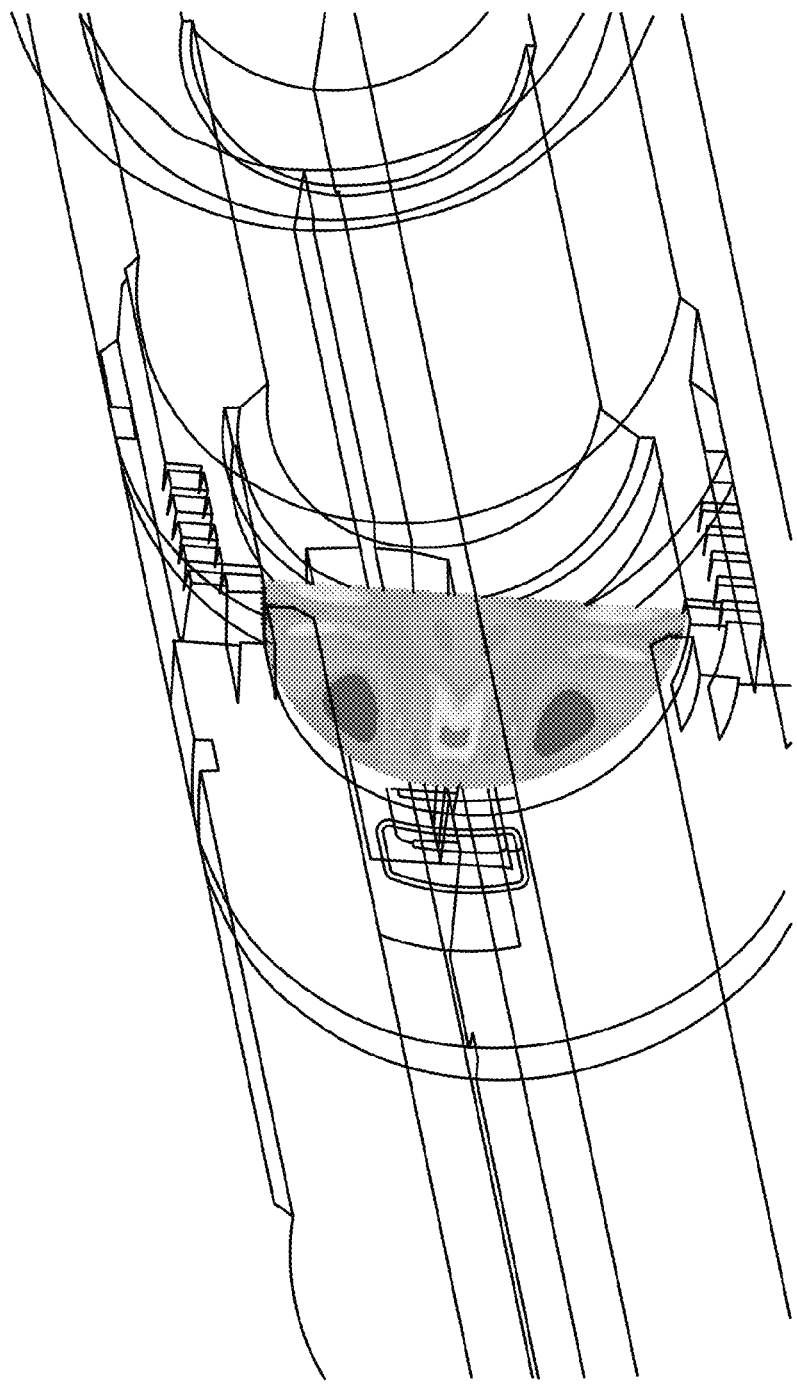
FIG. 11 shows the velocity field in a radial plane located slightly upstream of a large port.

FIG. 11 shows the velocity field in a radial plane located slightly upstream of the large port.

Figure 12A:
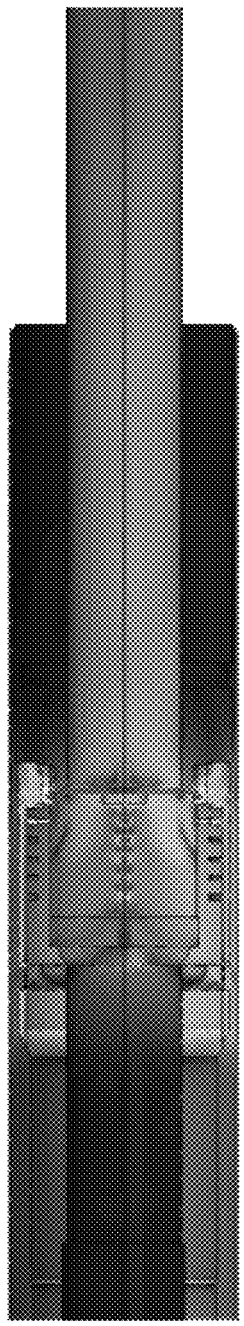
FIG. 12 shows velocities at a 0.0002 inch offset from surfaces of the well tool.
Figure 12B:
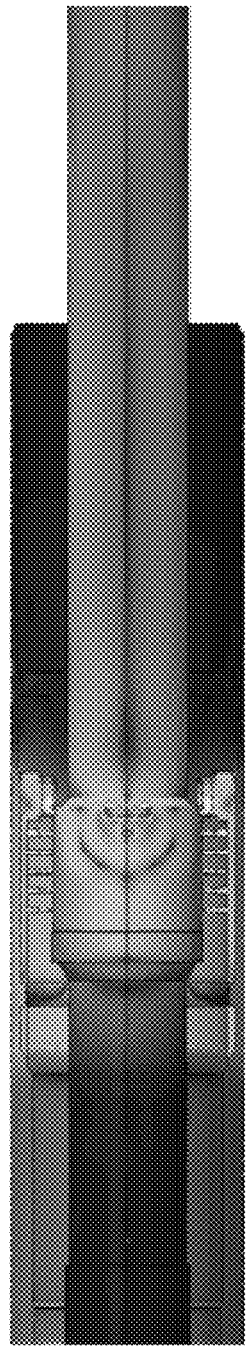

FIG. 12 shows velocities at a surface that is 0.0002 inch offset from the solid valve surfaces. This velocity field is utilized in the scaling model described more fully below.

CFD™ of Well Tool with Mandrel

CFD™ simulations described in this section pertain to the well tool in the test fixture (e.g., chamber 46, etc.) used for lab testing. Hence these simulations have been carried out at a low flow rate to match the flow rate used in the tests. The fixture includes a mandrel that was utilized to artificially increase the axial velocity of the fluid in certain areas of the flow domain.

The simulations were performed at different valve openings. The pressure drop characteristic is predominantly unchanged among these scenarios, due to the relatively low hydraulic resistance offered by the valve ports in relation to the inlet and outlet ports of the fixture. Hence the flow velocities are also nearly the same, except in the neighborhood of the valve ports.

FIGS. 13A-D depict fluid domain in the well tool test fixture (note the fluid flow is from left to right in these figures).

Figure 14A:
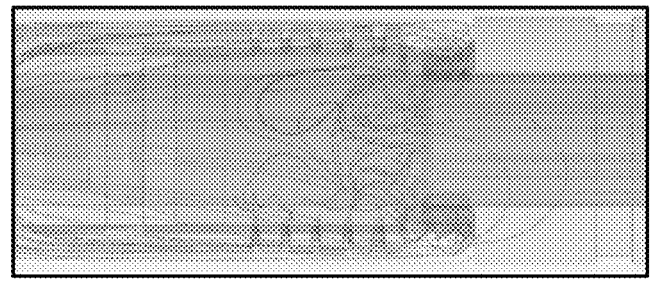
FIGS. 14A-C depict streamlines for three well tool positions (30% open, 60% open, 100% open).
Figure 14B:
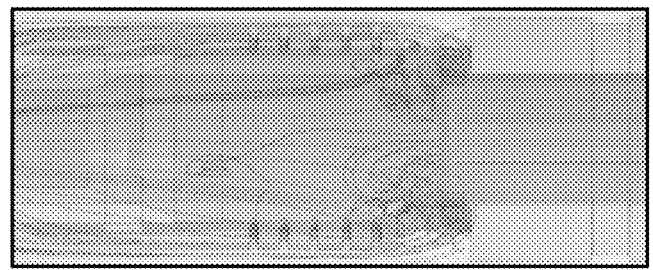
Figure 14C:
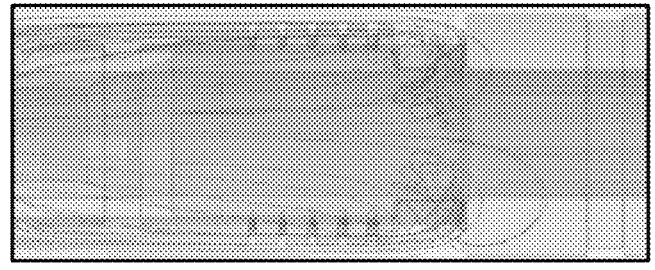

FIGS. 14A-C depict streamlines for the different well tool positions.

Figure 15A:
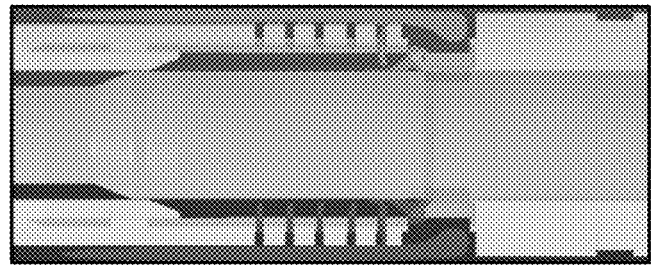
FIGS. 15A-C depict velocities for three well tool positions (30% open, 60% open, 100% open).
Figure 15B:
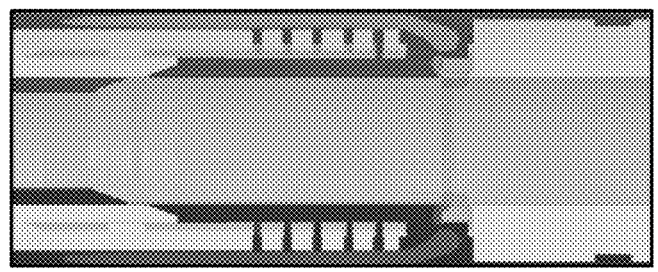
Figure 15C:
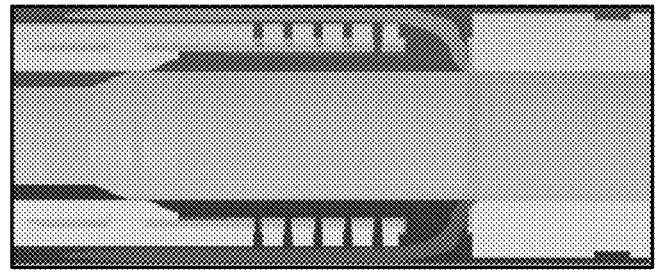

FIGS. 15A-C depict velocities for the corresponding well tool positions.

CFD™ of Reactor Vessel

Figure 16:
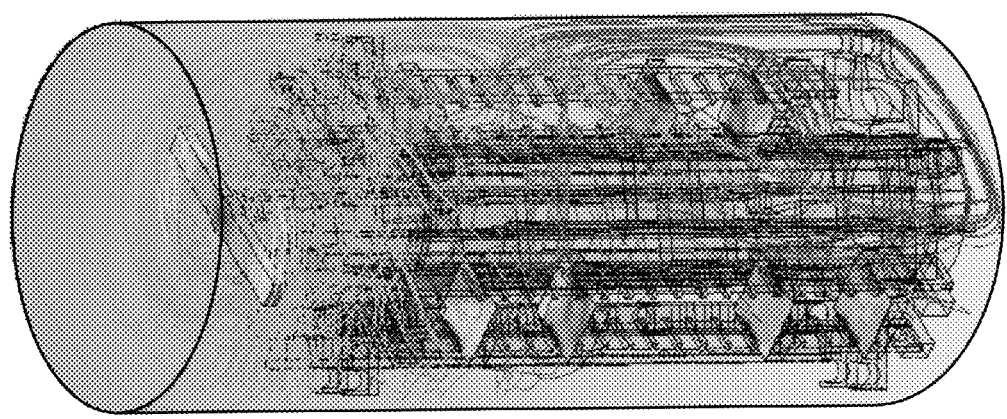
FIG. 16 representatively illustrates a velocity field in a reactor vessel.
Figure 17:
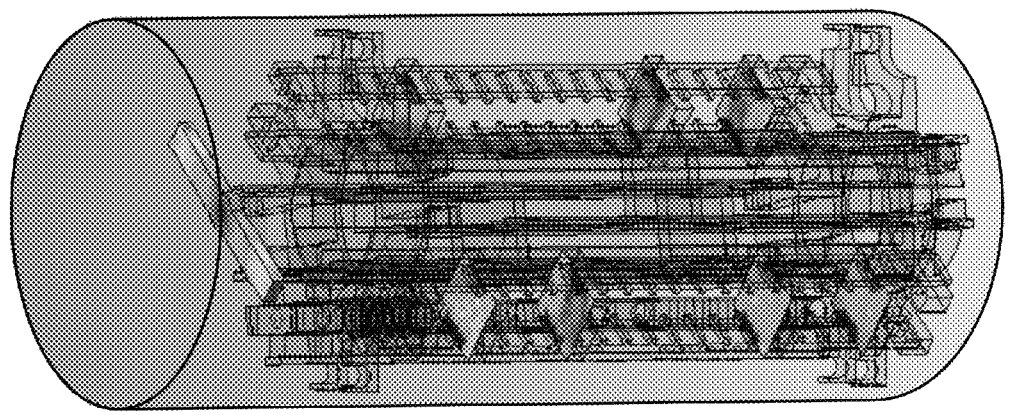
FIG. 17 representatively illustrates fluid velocities at an offset of 0.0002 inch above test coupon surfaces.

The CFD™ of the Reactor Vessel was carried out at a stirrer rotational speed of 100 rpm. FIG. 16 shows the velocity field in the reactor vessel, and FIG. 17 shows the fluid velocities at an offset of 0.0002 inch above the coupon walls.

For the example brines, $CaCO_3$ scale molecules are formed whenever favorable pressure, temperature, velocity and brine concentration conditions are reached. These molecules will exist throughout the fluid domain. Particles near the solid boundaries will tend to form crystals which will grow in the cavities of the surface roughness.

Depending upon the flow velocity field and the geometry of the boundaries (contacting the fluid) certain morphology of the crystalline structures will result. If the fluid velocities are above a certain threshold velocity, no large crystals will form, and a thin layer of small particles (smaller than 5 µm) will form on the boundaries.

The shear strength of these deposits is high enough to remain intact in the laminar boundary layers which exist near the solid boundaries. Subsequent layers of $CaCO_3$ will form on top of the first layer, progressively increasing the scale thickness. If the fluid velocities continue to remain below a certain threshold velocity, the growth of the scale will continue until physically blocking conditions result.

If the fluid velocities are above the threshold velocity, after formation of a layer of $CaCO_3$, no further accumulation will occur. This is due to erosion of the scale by the fluid and other solid particulate matter. The eroded scale particles along with the particles created in the fluid away from the boundaries are carried through the system.

In areas where the fluid velocities are low, some solids deposition will occur. It is conjectured that the solids deposited in this manner will not adhere to the solid surfaces, and can be easily lifted up by the fluid at high velocities and transported downstream. However, sizeable accumulation of these particles could result in blockage of passages in a fluid system thereby creating a failure.

The tests conducted in the reactor vessel using coupons provide the deposition data at different velocities, brine concentration, pressure, temperatures and time. A neural network model has been developed to quantify the experimental data, and is described more fully below.

Another factor that has a profound influence on the scaling behavior is the pressure drop. The forward chemical reaction of equation (1) below is favored if the pressure is reduced.

$$CaCl_2 + 2NaHCO_3 \leftrightarrow 2NaCl + CaCO_3\downarrow + H_2O + CO_2\uparrow \quad (1)$$

Hence, if a pressure drop occurs in the system, more scale ($CaCO_3$) is formed and deposited. In a flowing system, the pressure drop can be accounted for by considering the pressure gradient (dP/dx) as a continuous variable. A unique approach of quantifying the scaling process is described below.

Mathematical Model of Rate of Scale Growth

A Neural Network model has been created to predict the scale thickness in a given area for given flow conditions and material properties. The model is independent of the substrate material, using the data of coupon experiments.

General Neural Network Configuration

Figure 18:
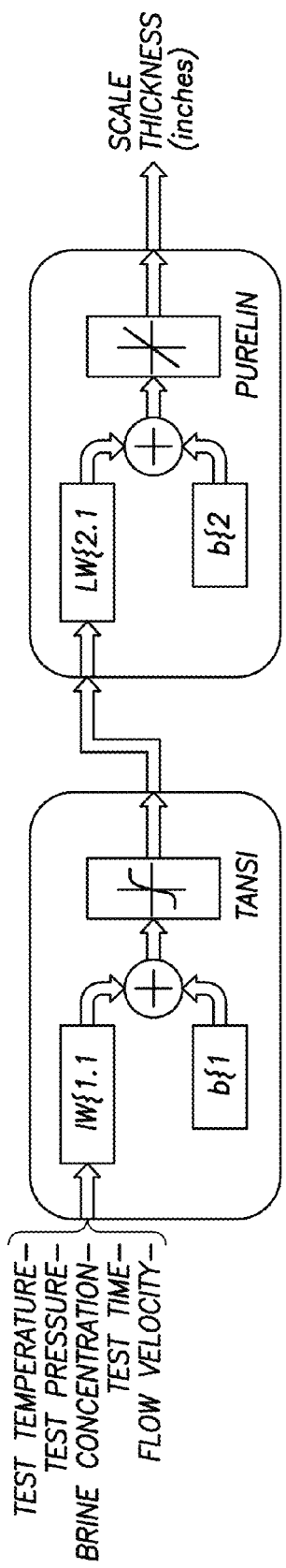
FIG. 18 is a schematic view of a neural network model.

The neural network model consists of two layers as depicted in FIG. 18.

The Scale Thickness is calculated by the following equations:

$$y_{norm}(i) = \left[2 * \frac{inNN(i) - \text{range\_INP}_{min}(i)}{\text{range\_INP}_{max}(i) - \text{range\_INP}_{min}(i)}\right] - 1 \quad (2)$$

for $1 \leq i \leq 5$

-continued $$n = IW_{1,1} * y_{norm} + b_1 \quad (3)$$

$$a_1(j) = \left[\frac{2}{1 + e^{-2*n(j)}}\right] - 1 \quad (4)$$

for $1 \le j \le 6$ $$a_2 = LW_{2,1} * a_1 + b_2 \quad (5)$$

$ScaleThickness =$ (6)

$$\left[\frac{(\text{range\_OUT}_{max} - \text{range\_OUT}_{min}) * (a_2 + 1)}{2}\right] + \text{range\_OUT}_{min}$$

Where the input is a normalized vector with the Test Temperature, Test Pressure, Brine Concentration, Test Time and Flow Velocity.

The general inputs for the neural network models are:
1. Test Temperature. The average value of the measured temperature for every experiment in degree centigrade.
2. Test Pressure. The average measured pressure for every experiment.
3. Brine Concentration. The nominal value of brine concentration for every experiment.
4. Test Time. The actual testing time of exposure of the coupons to the fluid in minutes.
5. The average Flow Velocity measured at a surface 0.0002 inches above the solid boundary wall.

The output is the scale thickness in inches.

The models were trained using a MATLAB™ Neural Network toolbox. The maximum number of epochs was 100. The data was divided into 90% for training and 10% for validation for each model. The validation data points for training were selected randomly. Bayesian Regulation back propagation (TRAINBR) was the training method selected. The training was conducted for hidden layer sizes from 1 to 6 neurons. The top 20 neurons were selected to check which inputs provided better results.

The inputs were normalized to be in the range (−1, +1). The normalization is executed for all inputs i from 1 to 5. n is the net input to the first layer. $IW_{1,1}$ is the input (or first layer) weight matrix and $b_1$ is the bias vector for the first layer. $a_1$ is the output of the first layer, with 6 neurons j from 1 to 6. $LW_{2,1}$ and $b_2$ are the weight matrix and bias for the second layer. The scalar output $a_2$ is also normalized in the range (−1, +1). The final scaling thickness is generated in inches.

The behavior of the models was evaluated by observing their response under various conditions covering the operating range of the variables. The best neural network had 6 neurons.

Figure 19:
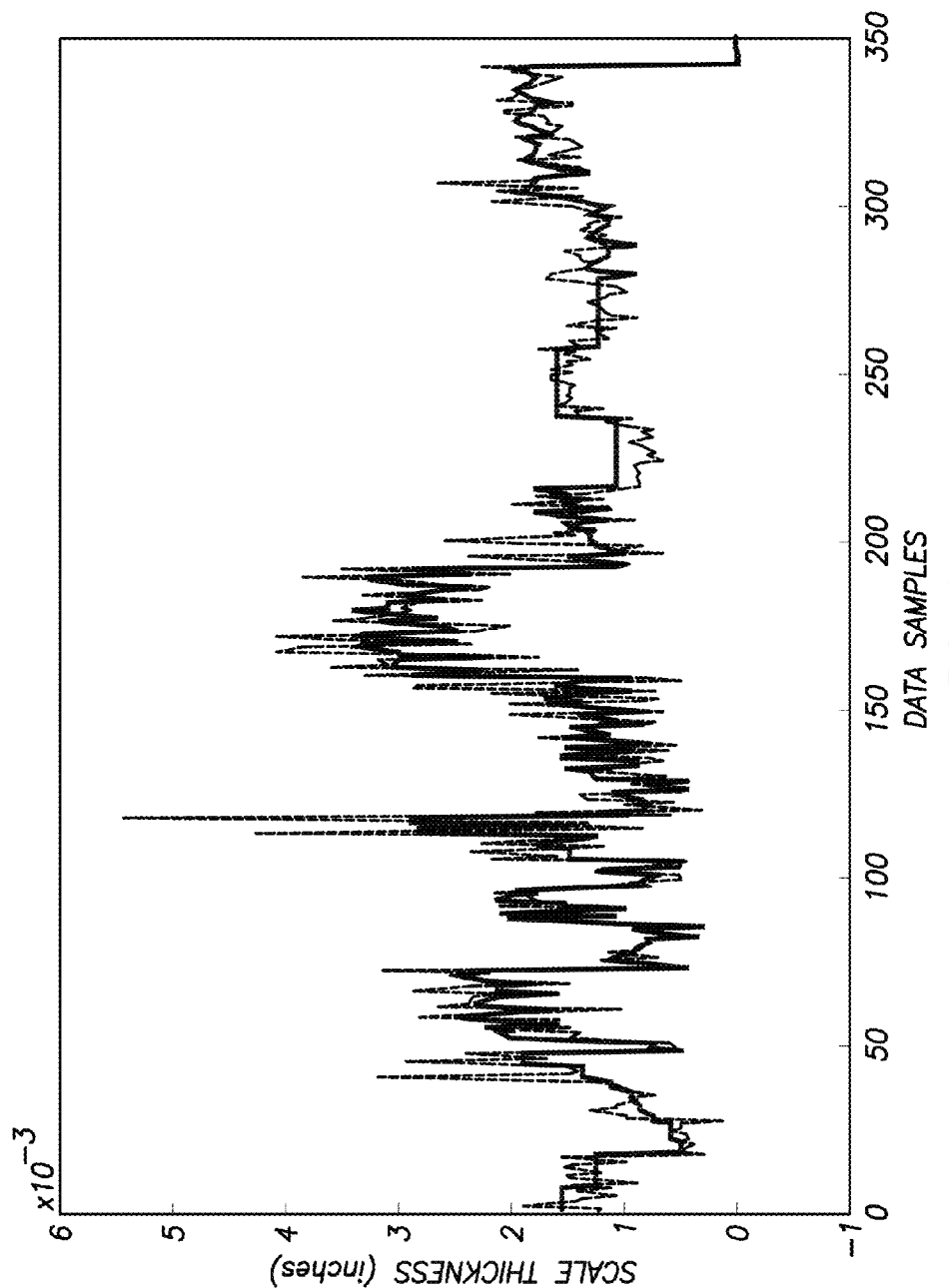
FIG. 19 is a representative graph comparing predicted and measured scale thicknesses.

FIG. 19 depicts the output of the static neural network (in solid lines) versus the complete static training data (in dashed lines) from coupon tests.

The scale thickness rate $r_s$ is calculated for a 1 minute interval by subtracting the scale thickness s for 1 and 0 minutes leaving the other inputs unchanged.

$$r_s = s_{t=1} - s_{t=0} = F_0(T,P,C,V) \quad (7)$$

Where
T=Fluid Temperature (° C.)
P=Pressure (psi)
C=Brine Concentration (%)
V=Fluid Velocity (m/s).
Scaling Model It was evident from the experimental results that in addition to the four variables, some additional effects must be considered in the model to make it more realistic. These effects included (a) gravity, (b) orientation of the surface with respect to the gravitational vector, (c) the pressure gradient dP/dx at a point on the solid surfaces exposed to the brine solution, and (d) velocity effects for velocities higher than the threshold velocity.

In equation (7) the function F, is the scale thickness rate (i.e. the rate of growth of the scale at a point on the solid surface) from the neural network model for a given Temperature, Pressure, Brine Concentration and Flow Velocity. The time interval is 1 minute. The proposed Scaling Model is as follows:

$$\dot{y} = F_1 F_2 + F_3 F_4 \quad (8)$$

Where
y-dot is the rate of scale growth, $$F_1 = \begin{cases} F_0 & \text{for } V_1 < V < V_2 \\ F_0(V_2) & \text{for } V \ge V_2 \\ 0 & \text{for } V \le V_1 \end{cases} \quad (9)$$

$$F_2|_{Z>0} = \begin{cases} -\text{Normal}_Z & \text{for Normal}_Z < 0 \\ 0 & \text{otherwise} \end{cases} \quad (10)$$

$$F_2|_{Z<0} = \begin{cases} \text{Normal}_Z & \text{for Normal}_Z > 0 \\ 0 & \text{otherwise} \end{cases} \quad (11)$$

The function $F_2$ defines the places where scale could be deposited due to the surface position with respect to gravity and the surface being concave or convex.

The terms $F_3$ and $F_4$ account for bonded scaling which is gravity-independent and for the pressure gradient on the scaling rate respectively:

$$F_3 = \begin{cases} K_1 F_0(V_2) & \text{for } V \ge V_2 \\ K_1 F_0 & \text{for } V_0 < V < V_2 \\ 0 & \text{otherwise} \end{cases} \quad (12)$$

$$F_4 = \frac{dP}{dN} \quad (13)$$

The values for the constants $V_0$ and $K_1$ were empirically determined by matching the experimentally observed plugging of the inlet tubing of the test fixture. The values for $V_1$ and $V_2$ were also empirically obtained from the experimental data as the ones that gave the best results.

The model developed in the preceding section has been implemented as a post processor in a CFD™ code and results for two cases are described below.

Scale Growth in Well Tool with Mandrel in Lab Test

This Section gives the simulation results of the well tool in the fixture which included the mandrel. FIGS. 20-31 show the predicted scale growth rate for one simulation run.

Figure 20:
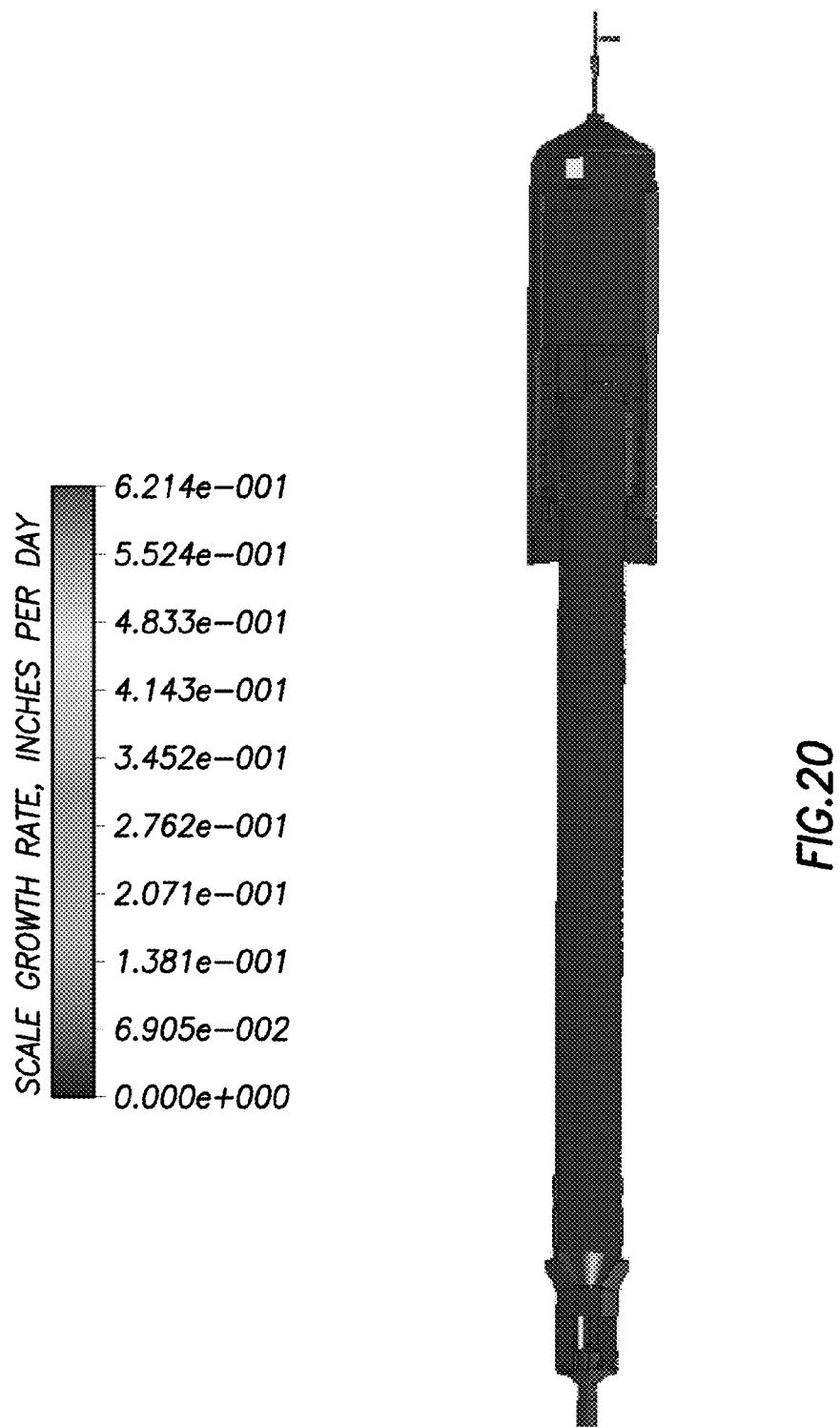
FIG. 20 is a representative plot of scale buildup predicted with a mathematical model, with a maximum scaling rate of 0.621 in/day.
Figure 21:
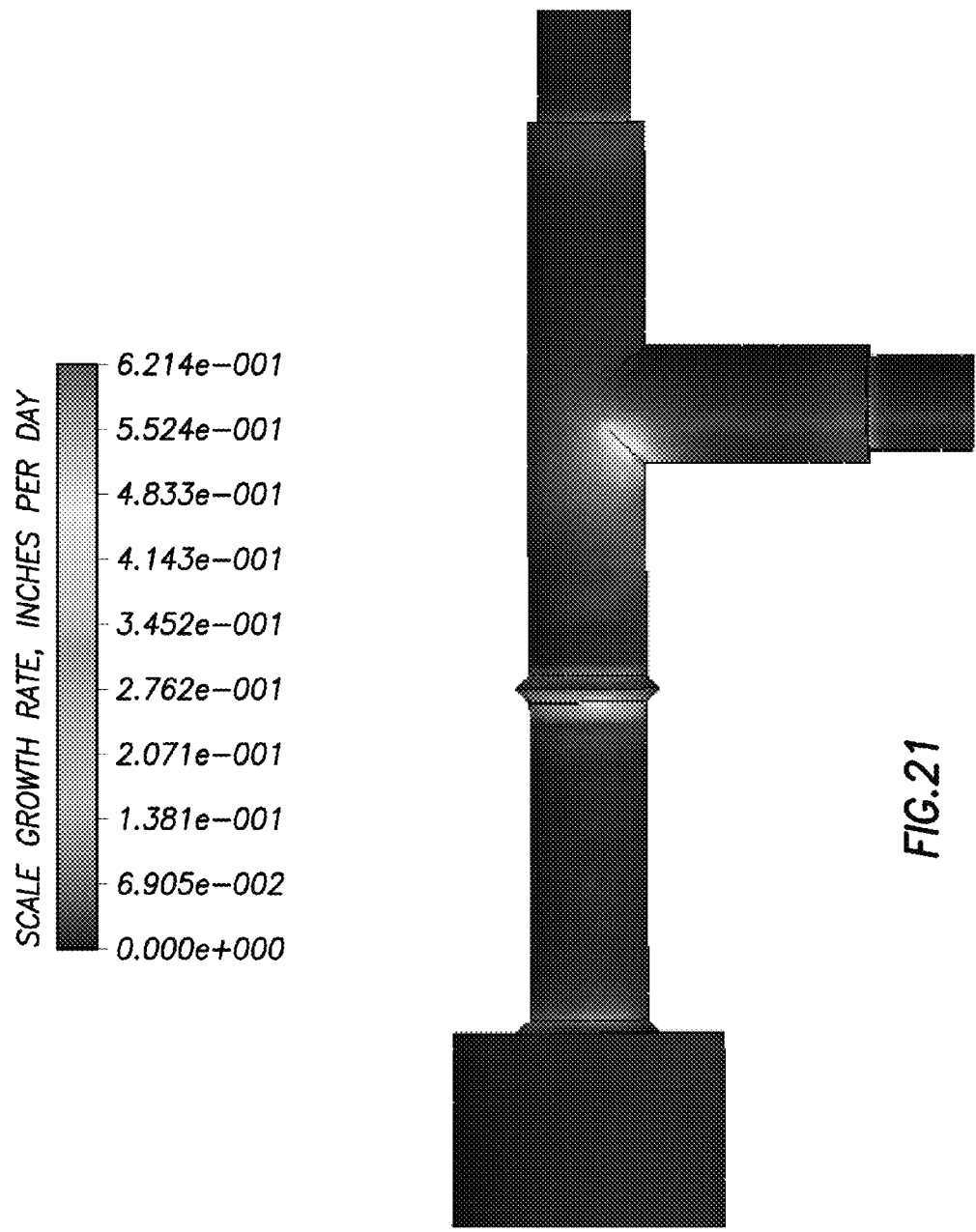
FIG. 21 is an enlarged scale view of a region having a highest scaling rate.

FIG. 20 shows the results with a maximum scaling rate of 0.6 in/day. This value occurs in the inlet tee (junction 44) downstream of the point where Solution 1 and 2 meet. (Note the fluid flow direction in these figures is from right to left.) The scaling rate is several orders of magnitude smaller everywhere except at those few points, and hence the figure looks blue everywhere.

Expanding the inlet region (see FIG. 21) shows the region of the highest scaling rate to be near the left corner of the tee. There is a fair amount of scale growth at the left end of the tee and also at the cross-section change on the left in FIG. 21.

Figure 22:
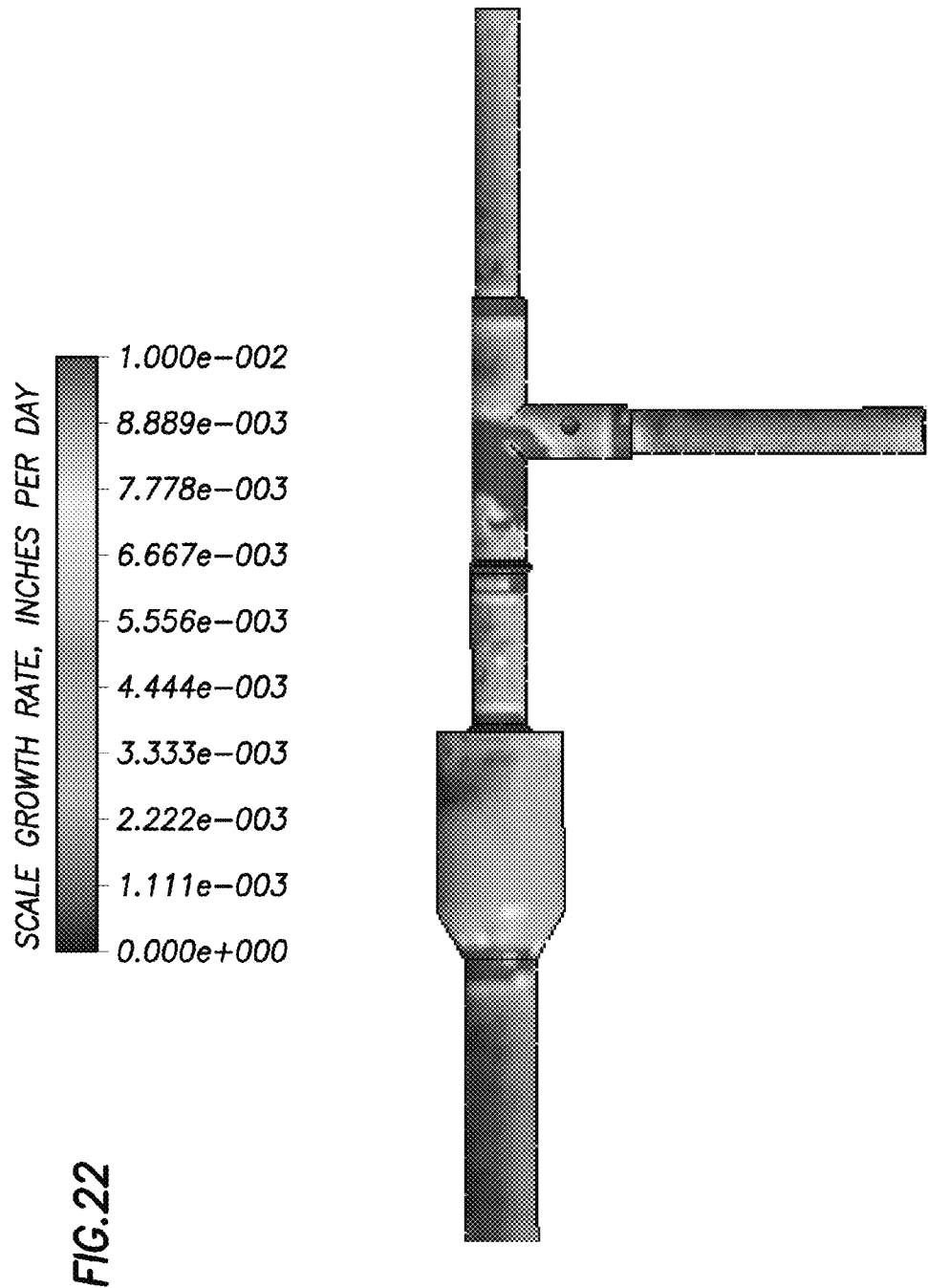
FIG. 22 is a representative plot of the scaling rate in the region at a lower maximum plotting scale.

Lowering the maximum plotting scale reveals further details as shown in FIG. 22.

Figure 23:
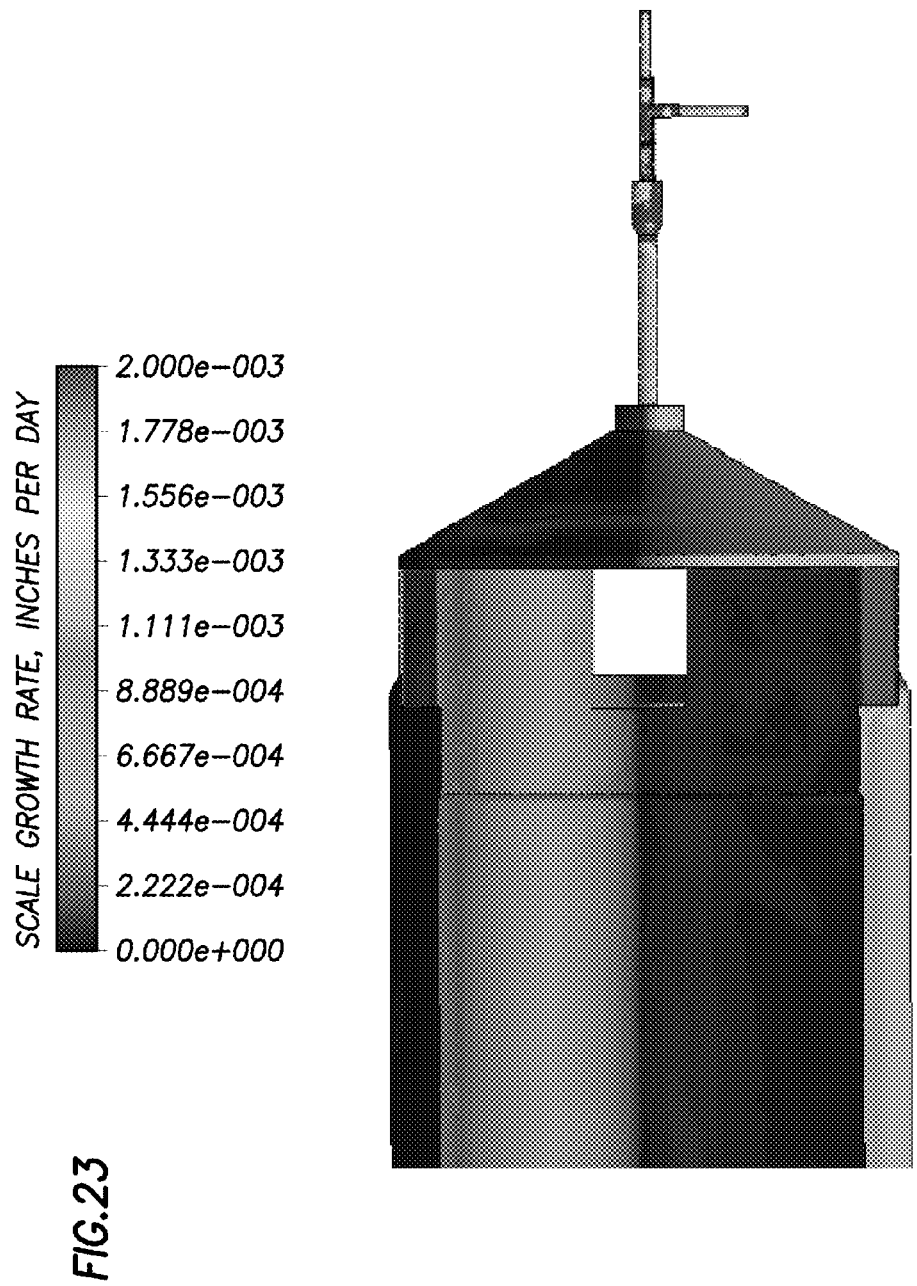
FIG. 23 is a representative plot of the scaling rates inside an inlet end of a fixture.
Figure 24:
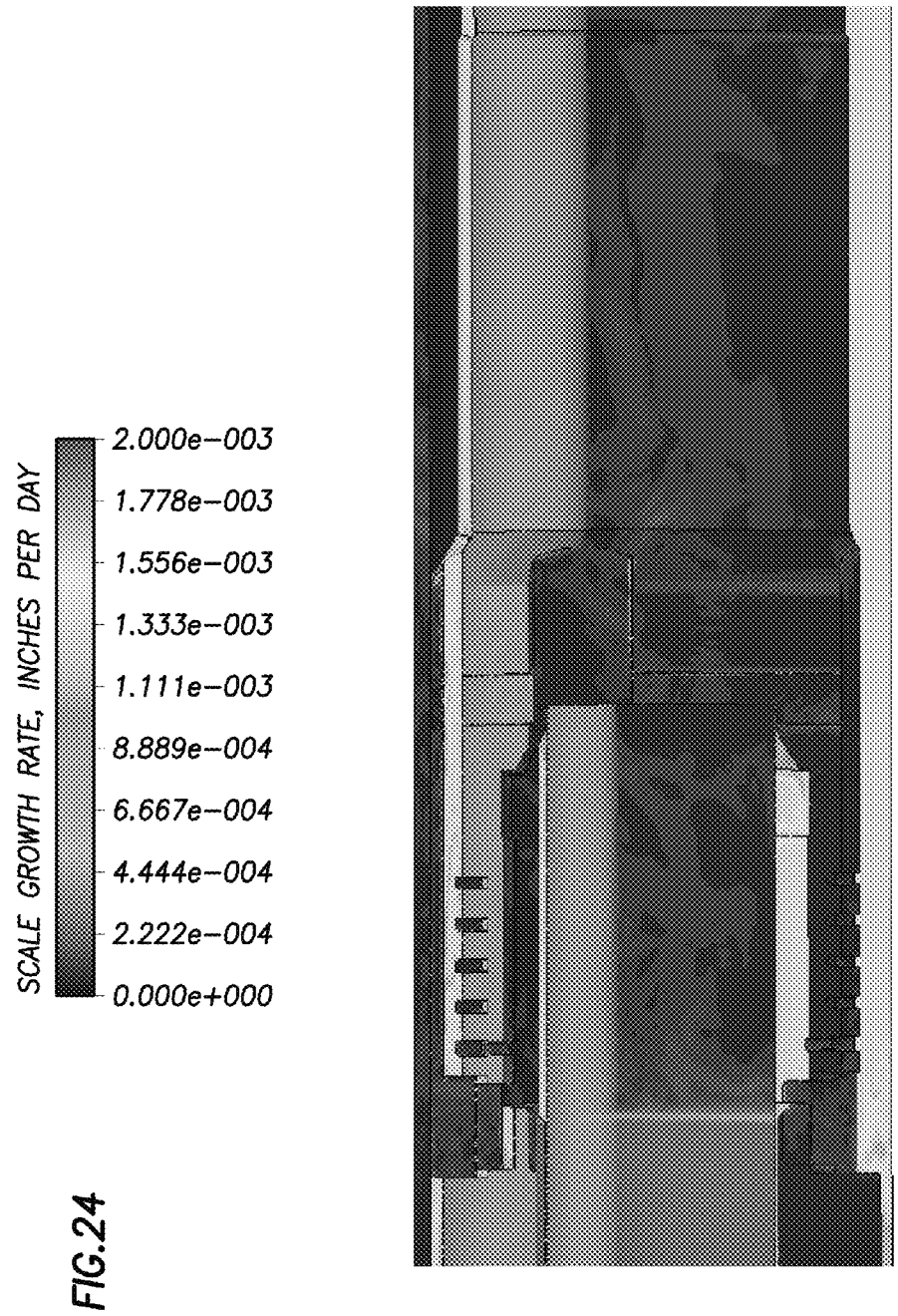
FIG. 24 is a representative plot of the scaling behavior at a flow ports area.
Figure 25:
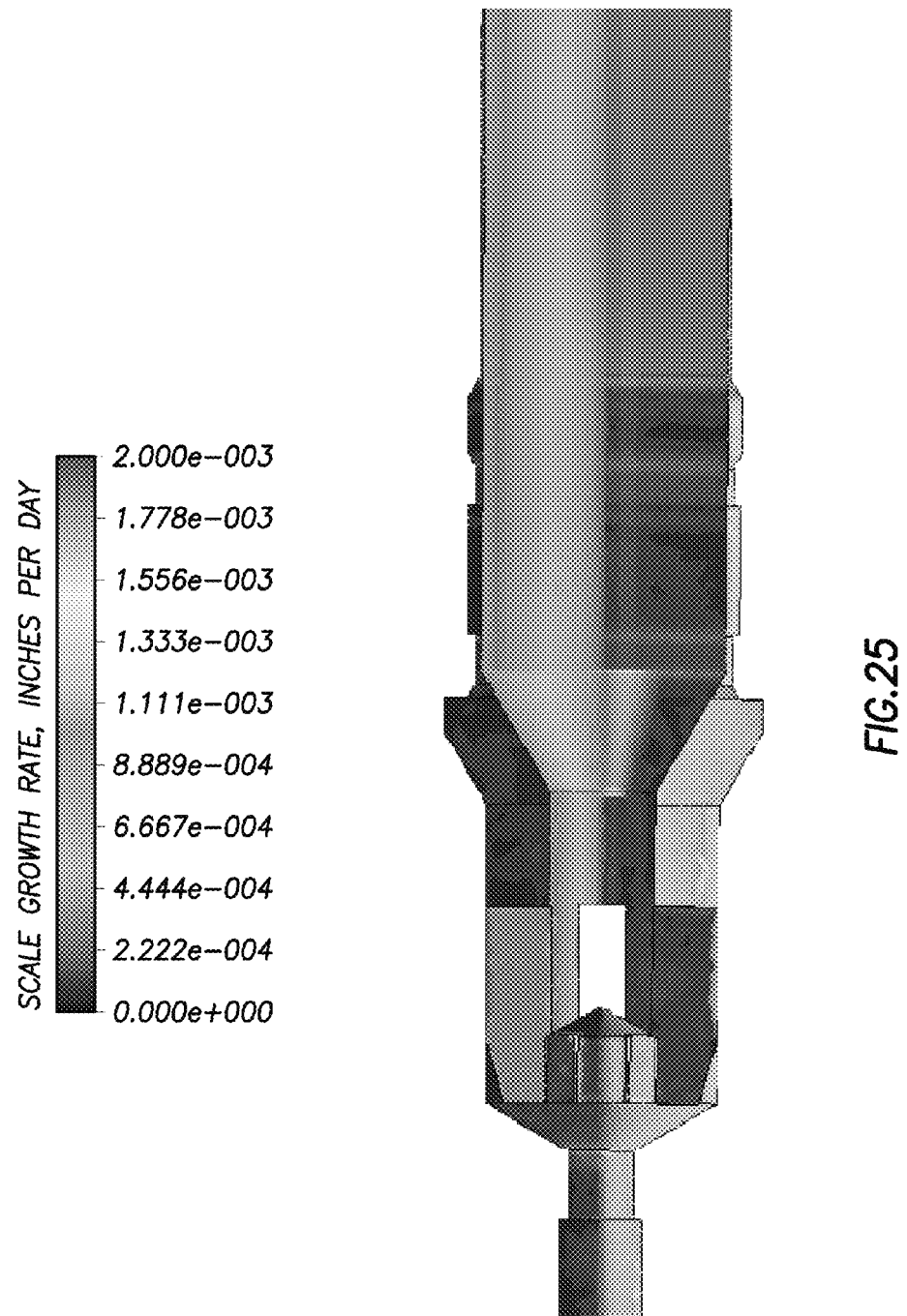
FIG. 25 is a representative plot of the scaling behavior at an outlet.
Figure 26:
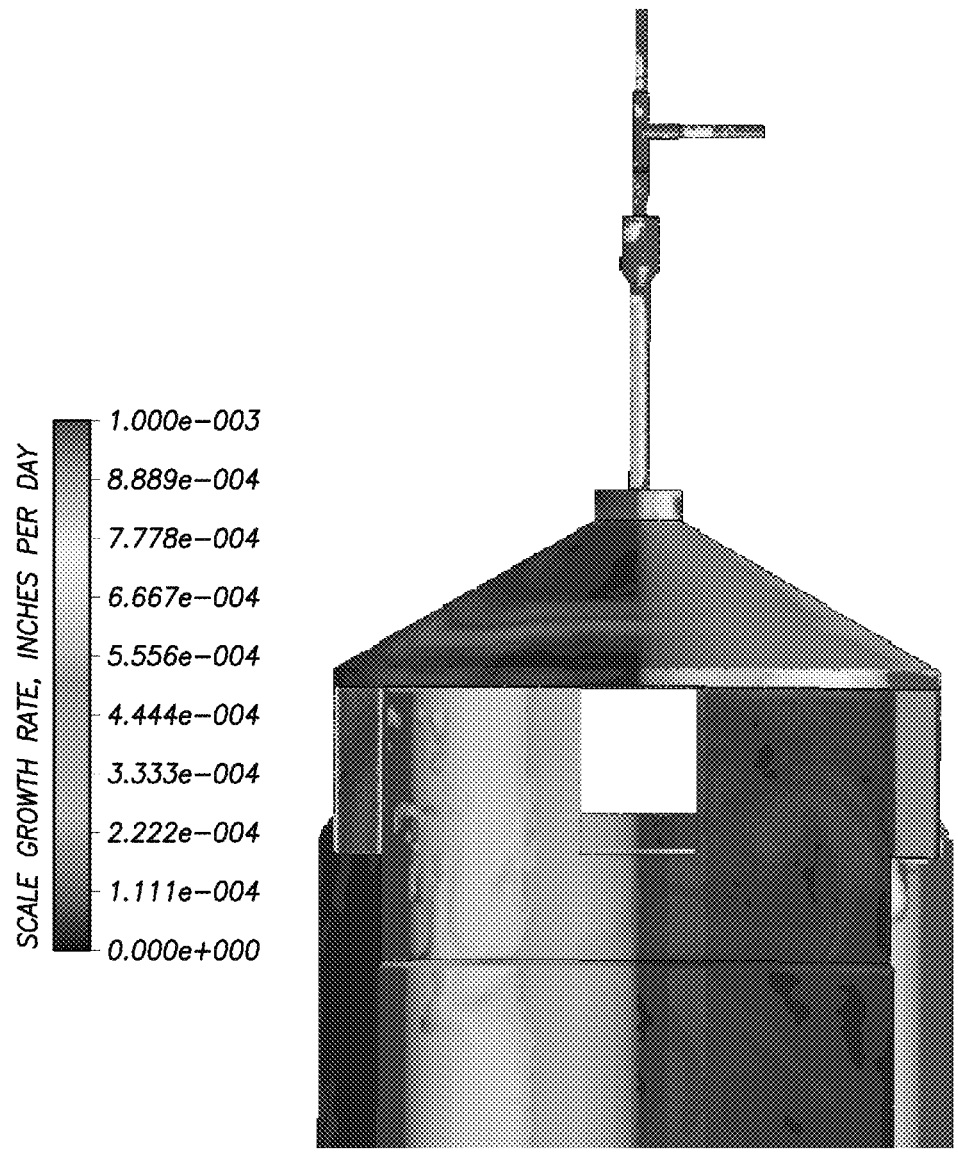
FIGS. 26-29 are representative plots of scale buildup rates with a lower display range of 0.001 inch/day.
Figure 27:
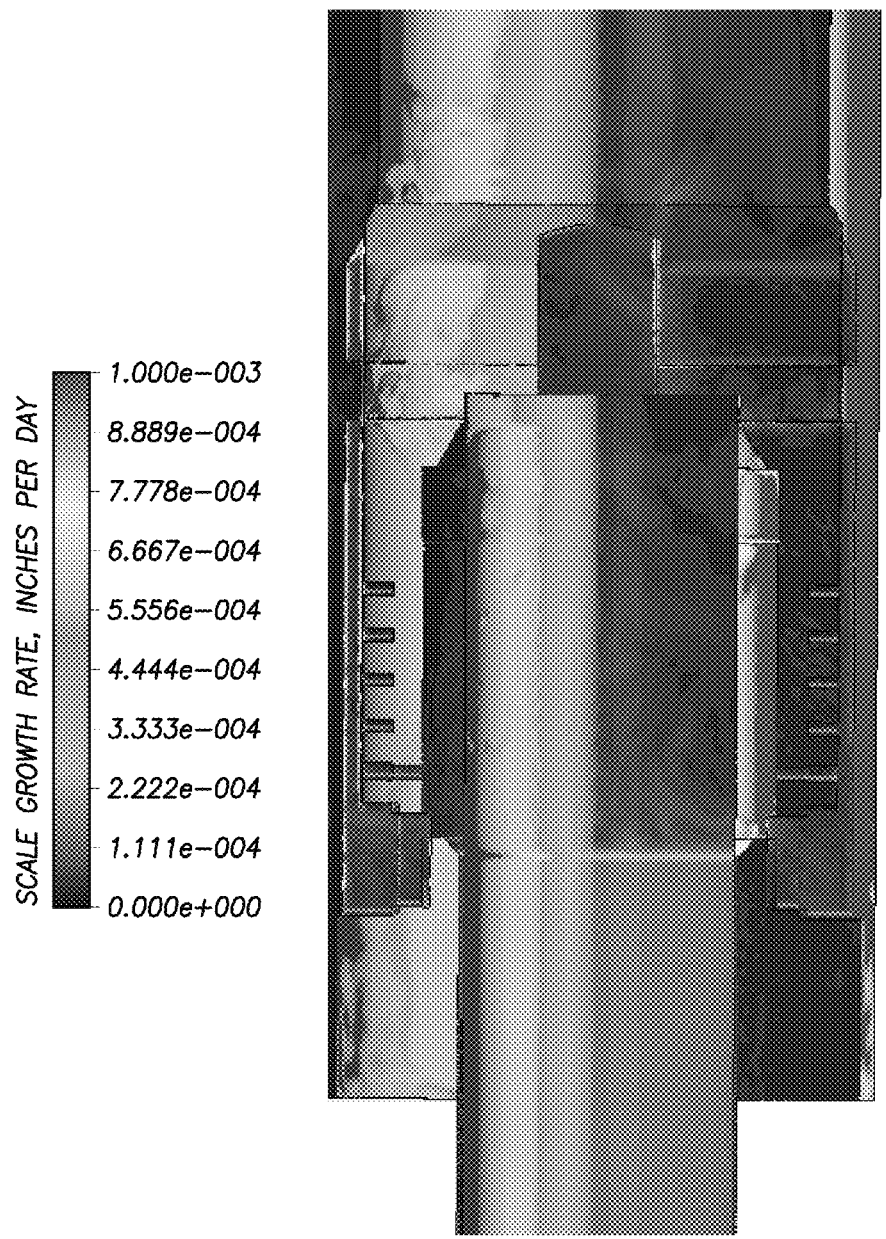
Figure 28:
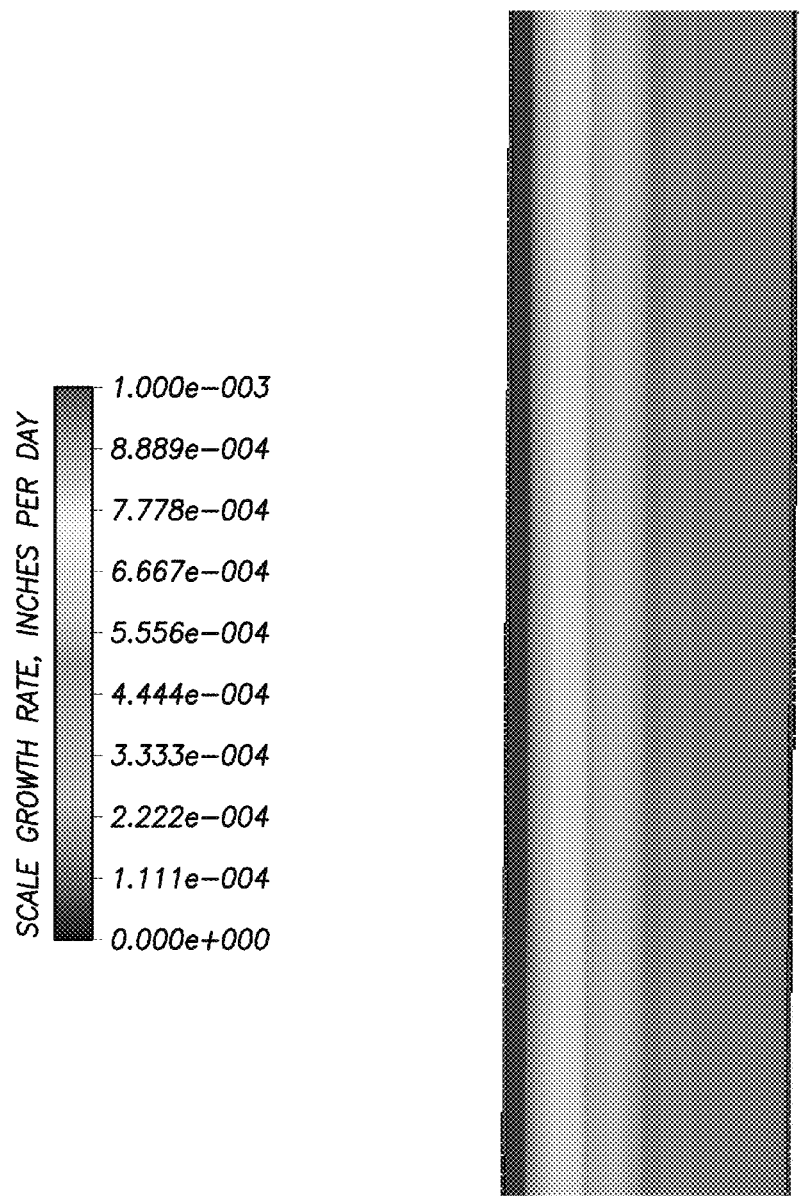
Figure 29:
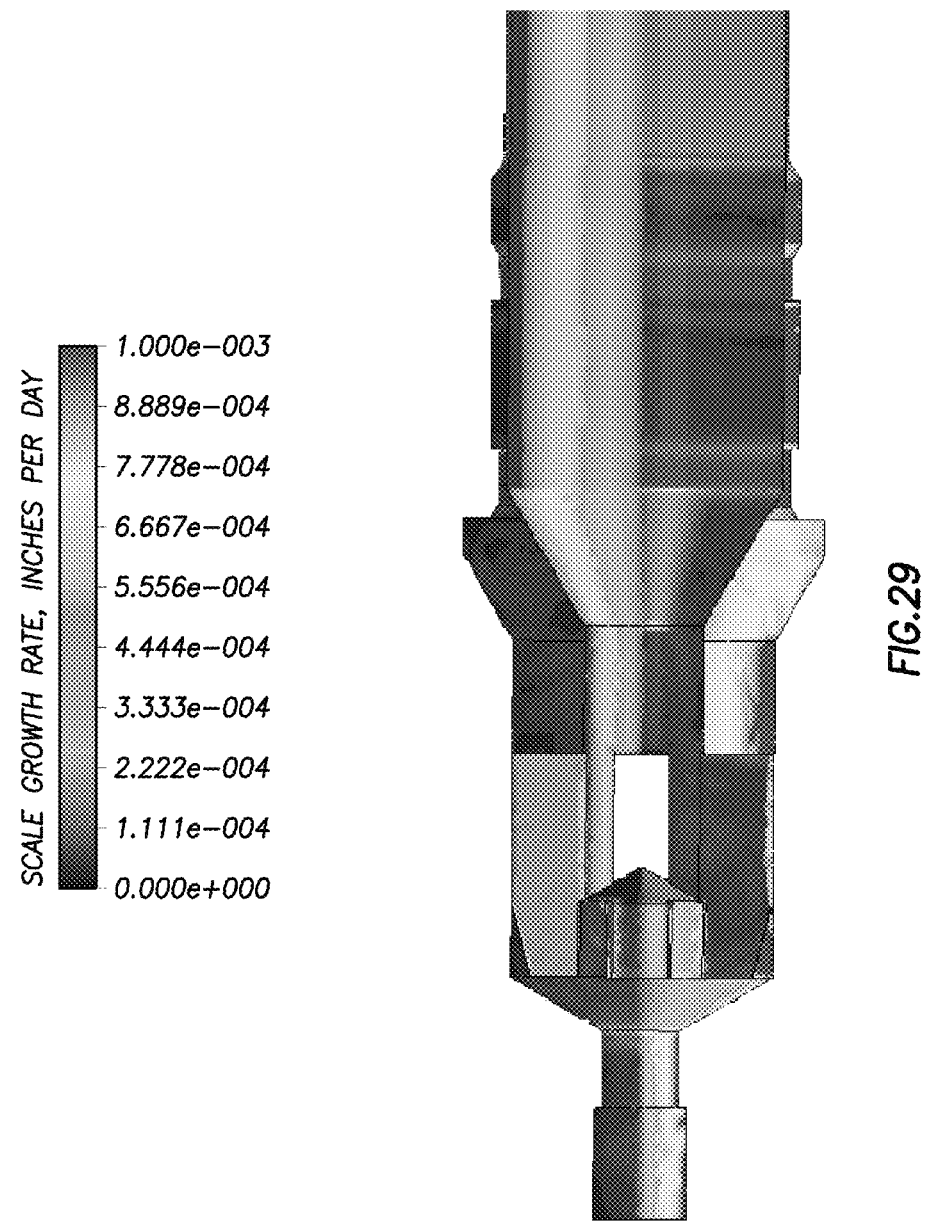

FIG. 23 shows the scaling rates inside the inlet end of the fixture. The higher rates at the bottom compared to the top are due to the deposition mechanism. FIG. 24 shows the scaling behavior at the flow ports area, and FIG. 25 shows the results in the outlet. These contour plots have been made with a display range of 0.002 in/day.

FIGS. 26-29 show similar plots with a lower display range of 0.001 inch/day. Note the uniform rate of scale growth on the mandrel in FIG. 30 which was also observed in the experimental results.

Figure 30:
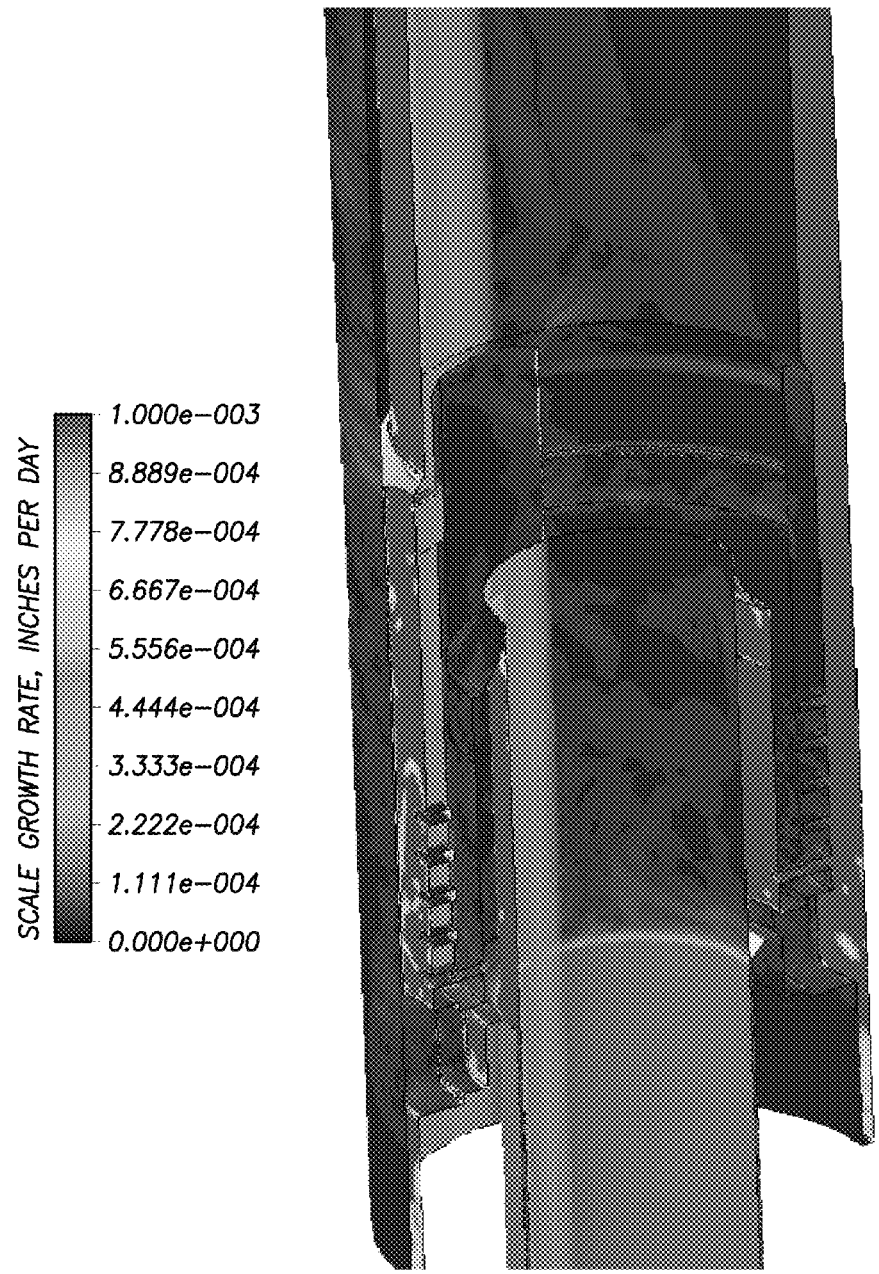
FIG. 30 is a representative plot of a rotated view of the flow ports area.
Figure 31:
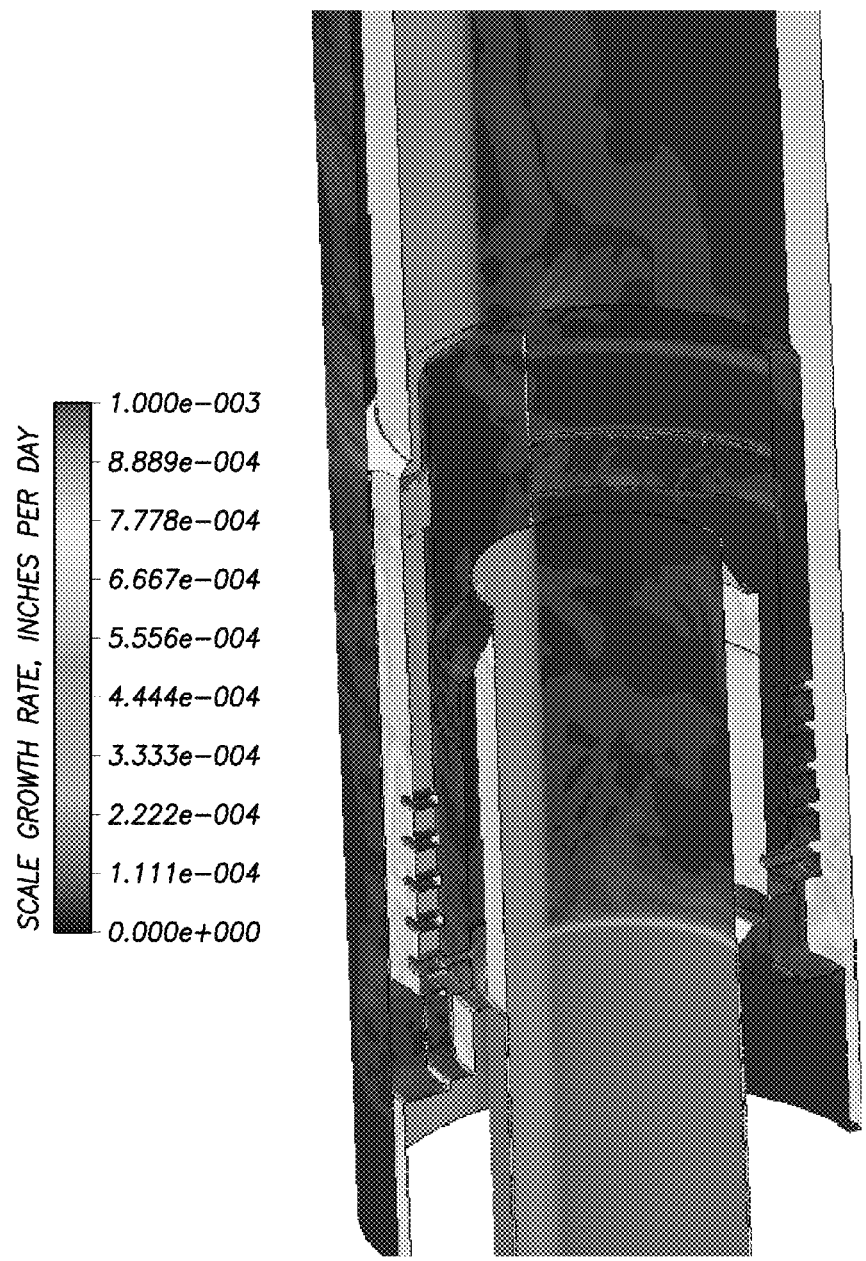
FIG. 31 is a representative plot of the same view as FIG. 30 with a different display range (0.001 in/day).

FIG. 30 shows a rotated view of the flow ports area. FIG. 31 shows the same view with a different (0.001 in/day) display range. From this figure, the scale growth rates for the Bottom Sub, the Ported Housing and the Piston areas can be obtained.

Comparison with Test Data

The numerical predictions of the scale growth rate were compared with the measured values from the full size valve tests, and were found to be in reasonable agreement.

Predictions for Actual Well Tool Performance—Plugging Failure Mode

The well tool was modeled in a downhole environment for example downhole conditions.

The simulation assumes that the well tool is at the very bottom of the completion, so there is no fluid flow from below the well tool. The fluid entry is only through the ports in the well tool. Further, fluid is assumed to be of 100% composition throughout the valve.

Figure 32:
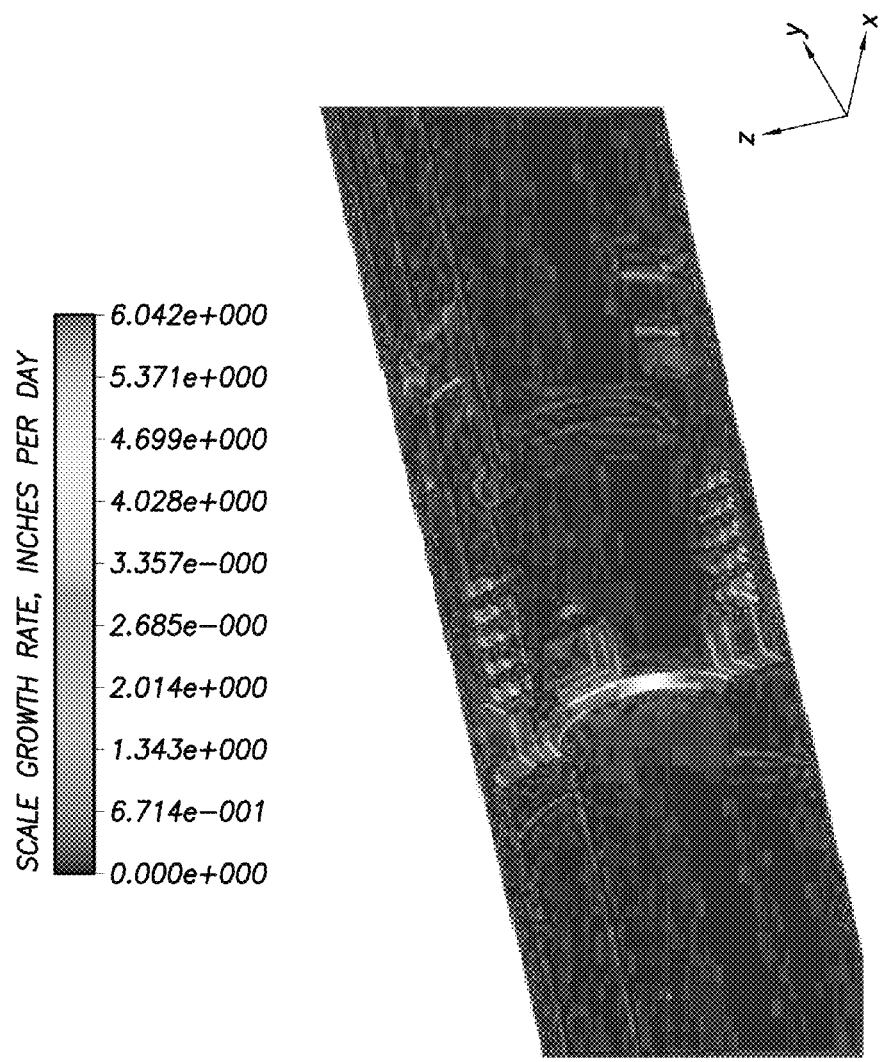
FIG. 32 is a representative plot of results for a 100% open valve.

FIG. 32 shows results for a full open valve. The maximum scale growth predicted is 6 inches/day only at a few points in the inside of the valve in the vicinity of the port area. This scale is unlikely to grow large due to unsupported areas which will cause erosion of the scale.

Figure 33:
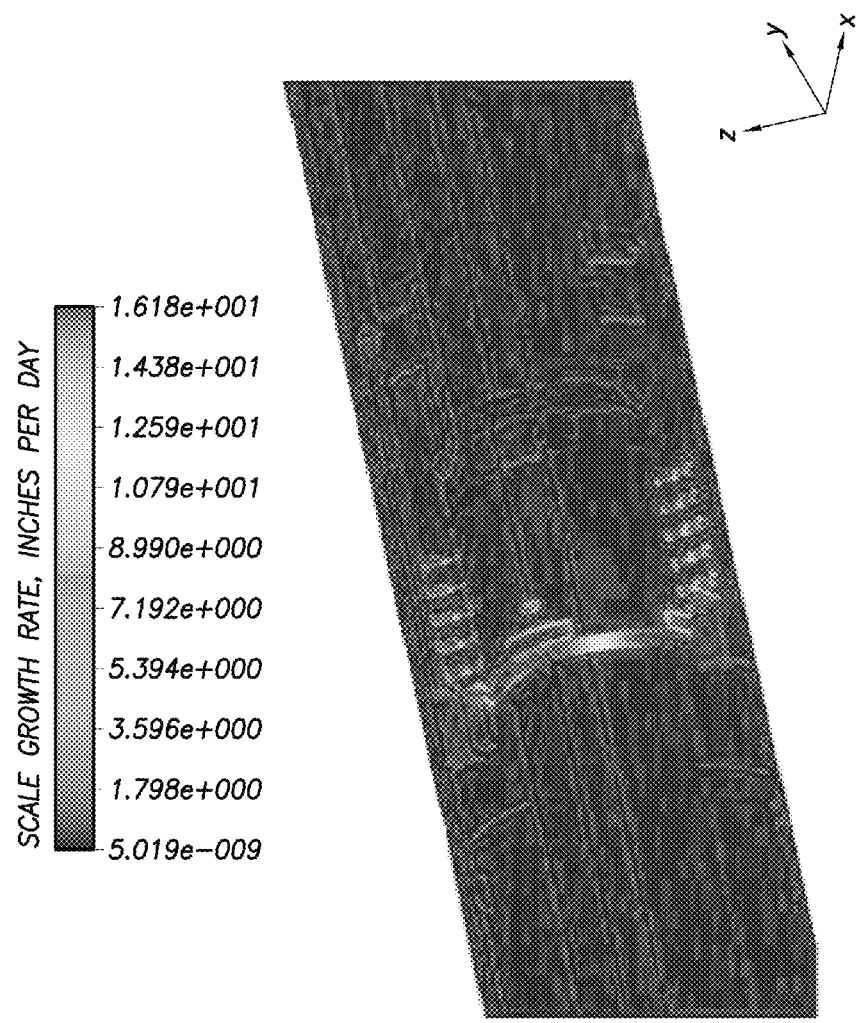
FIG. 33 is a representative plot for 30% valve opening.

FIG. 33 shows a similar plot for a smaller valve opening (other conditions remain unchanged). For this case, the maximum scaling rate is again in the same general location as the one for FIG. 34.

Figure 34:
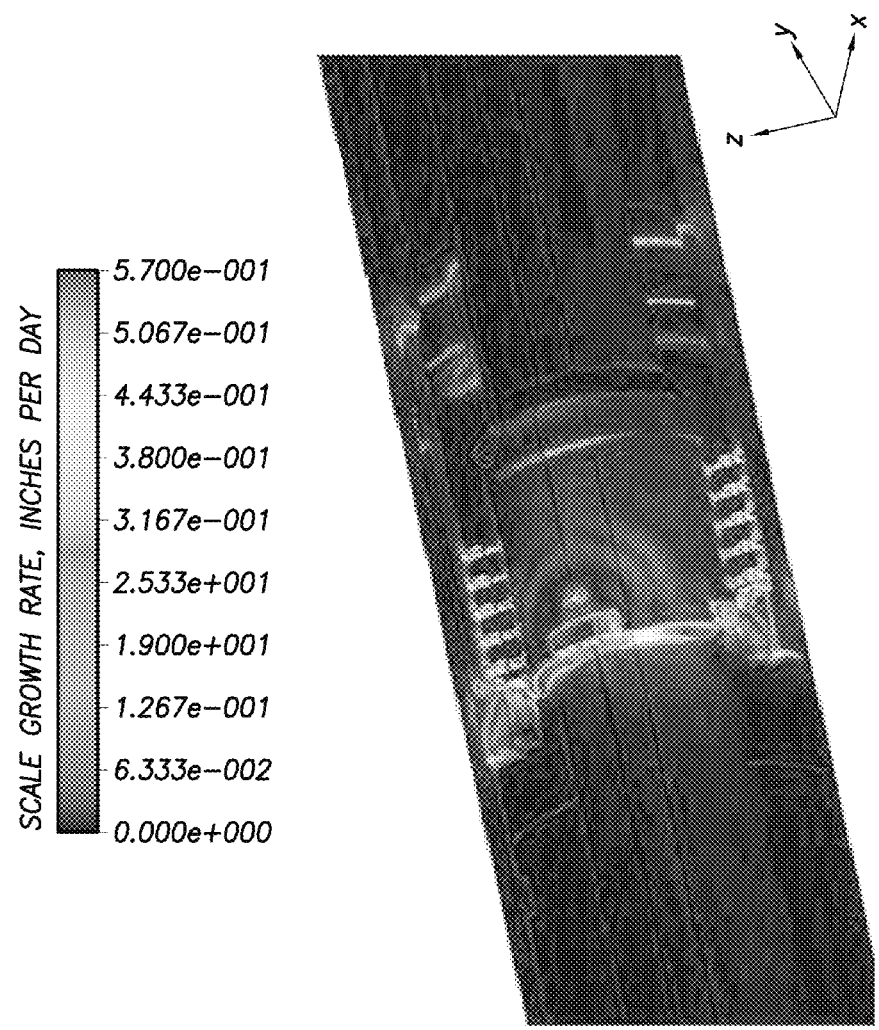
FIG. 34 is an enlarged scale representative plot, similar to FIG. 33, but using a lower display range of 0.57 in/day.

FIG. 34 shows more details of FIG. 33 by using a lower display range. This indicates that the smaller ports (except the large slot at the end) will likely be plugged up fairly quickly (in a day or less). The slot should not plug up due to fluid erosion and due to lack of mechanical support on the downstream side for the scale.

Figure 35:
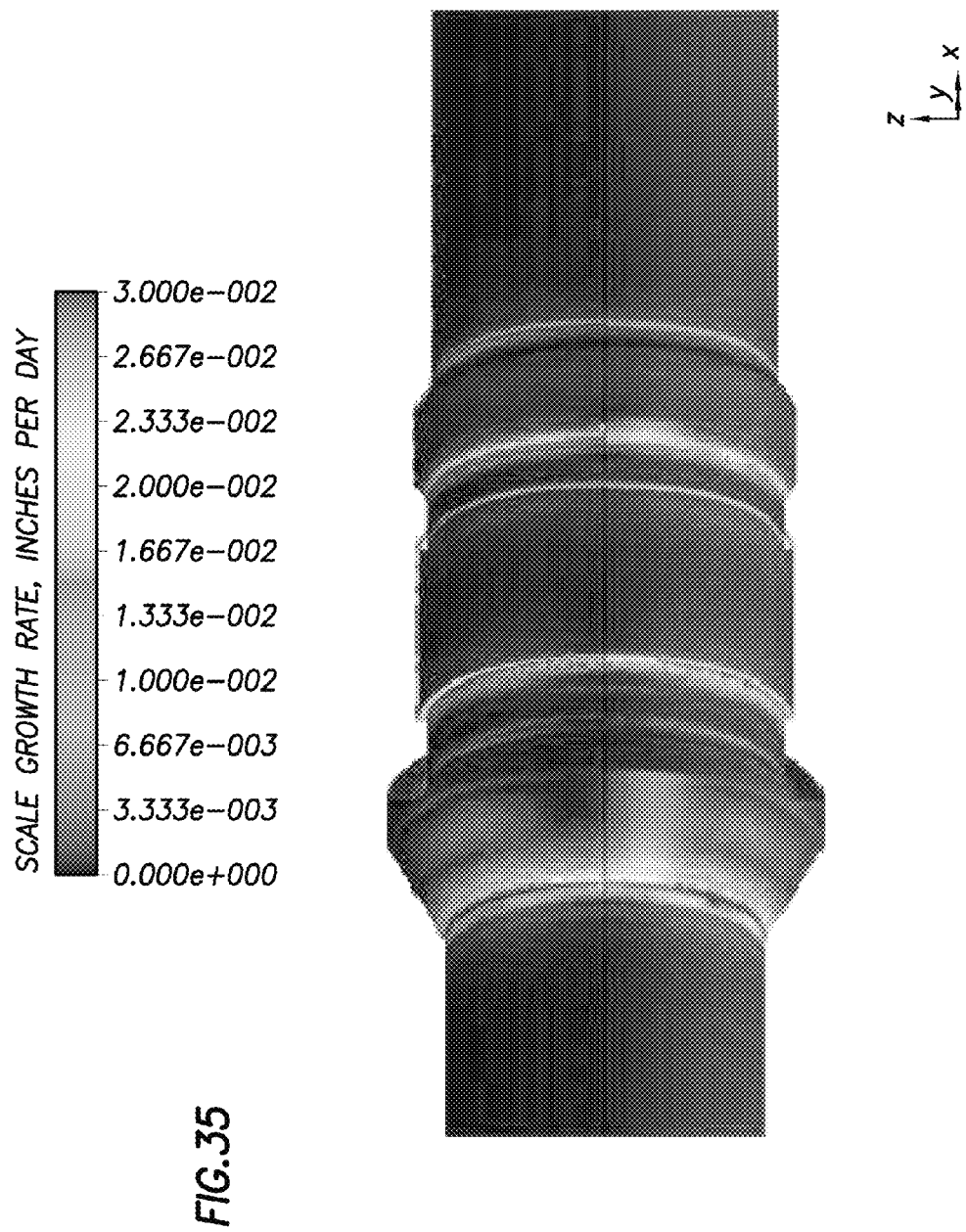
FIG. 35 is a representative plot of the scale growth near the outlet area.
Figure 36:
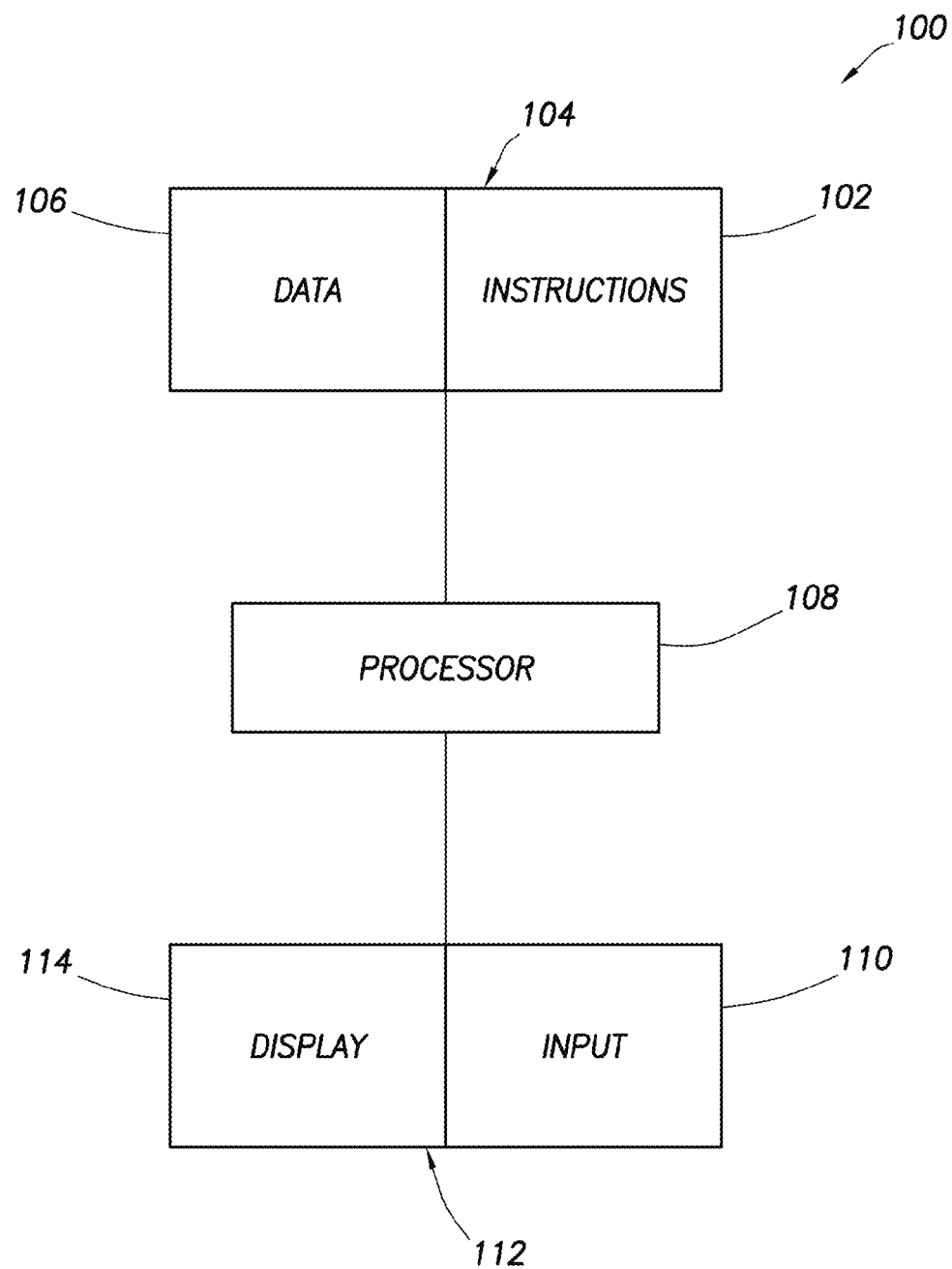
FIG. 36 is a representative diagram of a computing system which may be used to perform the method of constructing a well tool.

FIG. 35 shows the scale growth near the outlet area. The scale growth rate is higher than in other locations. Extrapolating this will give the number of days the valve can become plugged fully.

The basic methodology developed here for prediction of the rate of scaling in completion equipment in a downhole environment is empirical in nature. The empirical model appears to contain the essential influencing parameters. The effect of changes in pH has been indirectly accounted for through the use of the pressure gradient dP/dx.

The model can be applied to other operating conditions to observe the sensitivity of scaling to different operating conditions. The pressure, temperature, brine concentration and flow rate can be varied to observe their influence on scaling.

The mathematical model can be improved by incorporating the chemical reactions from first principles. This will enhance the accuracy of the model over a wider range of operating parameters, and would also allow applications to other brine chemistries such as those forming $BaSO_4$ scales.

It may now be fully appreciated that the above disclosure provides significant advancements to the art of reducing scale buildup on well tools. In examples described above, methods are provided to the art for testing scale buildup on a well tool, for predicting scale buildup on the well tool, and for constructing the well tool.

In one method 60 of testing scale buildup 26 on a well tool 12, the method can comprise: pressurizing separate cationic and anionic solutions 32, 34; then heating the separate cationic and anionic solutions 32, 34; mixing together the cationic and anionic solutions 32, 34; and exposing the well tool 12 to the mixed cationic and anionic solutions 52.

The mixing step is preferably performed after the heating step. The exposing step is preferably performed after the mixing step.

The method 60 can also include cooling the mixed cationic and anionic solutions 52. The cooling step can be performed after the exposing step.

The method 60 can include reducing pressure of the mixed cationic and anionic solutions 52. The reducing pressure step is preferably performed after the cooling step.

The pressurizing step can be performed in multiple stages.

The method 60 can also include heating the well tool 12. The well tool 12 heating may be performed prior to and during the exposing step.

In the above disclosure, a well tool 12 can be constructed by a method 72 comprising:

a) determining velocities of fluid 14 flow at a predetermined offset from surfaces of a geometric model representative of the well tool 12;

b) calculating scale buildup 26 on the surfaces based at least in part on the determined velocities;

c) reducing pressure change per unit distance dP/dx along selected ones of the surfaces having greater than a predetermined level of calculated scale buildup 26; and d) repeating steps a-c until all scale buildup 26 calculated in step b is no greater than the predetermined level.

The method 72 can also include using steps a-d to design a geometry of the well tool surfaces, thereby minimizing the scale buildup 26.

The method 72 can comprise constructing the well tool 12 having the well tool surfaces geometry.

The reducing step can include reducing the velocities corresponding to the selected ones of the surfaces.

The calculating step can include inputting the velocities to a mathematical model which calculates the scale buildup 26. The mathematical model may comprise a neural network.

The determining step can include determining pressures in the well tool 12, and/or determining pressure change per unit distance dP/dx along the surfaces.

The calculating step can include inputting the pressure change per unit distance dP/dx along the surfaces to a mathematical model which calculates the scale buildup 26.

The calculating step can be performed by a computing system 100 comprising at least one processor 108.

A method 84 of predicting scale buildup on a well tool 12 is also described above. In one example, the method can include inputting at least one parameter indicative of flow through the well tool 12 to a mathematical model; and the mathematical model determining a rate of scale buildup 26 on a surface of the well tool 12.

The parameter may comprise a velocity of fluid 14 flow at a predetermined offset from the well tool surface. The parameter may comprise a change in pressure per unit distance dP/dx along the well tool surface.

The determining step may include determining a total scale buildup 26 on the surface over time. The total scale buildup 26 includes scale deposited by gravity on the well tool surface, and scale bonded to the well tool surface.

The method 84 can include inputting to the mathematical model at least one parameter indicative of a fluid 14 composition.

The method 84 can include inputting to the mathematical model pressures along the well tool 12 surface.

Although various examples have been described above, with each example having certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Although each example described above includes a certain combination of features, it should be understood that it is not necessary for all features of an example to be used. Instead, any of the features described above can be used, without any other particular feature or features also being used.

It should be understood that the various embodiments described herein may be utilized in various orientations, such as inclined, inverted, horizontal, vertical, etc., and in various configurations, without departing from the principles of this disclosure. The embodiments are described merely as examples of useful applications of the principles of the disclosure, which is not limited to any specific details of these embodiments.

In the above description of the representative examples, directional terms (such as "above," "below," "upper," "lower," etc.) are used for convenience in referring to the accompanying drawings. However, it should be clearly understood that the scope of this disclosure is not limited to any particular directions described herein.

The terms "including," "includes," "comprising," "comprises," and similar terms are used in a non-limiting sense in this specification. For example, if a system, method, apparatus, device, etc., is described as "including" a certain feature or element, the system, method, apparatus, device, etc., can include that feature or element, and can also include other features or elements. Similarly, the term "comprises" is considered to mean "comprises, but is not limited to."

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of this disclosure. For example, structures disclosed as being separately formed can, in other examples, be integrally formed and vice versa. Accordingly, the foregoing detailed description is to be clearly understood as being given by way of illustration and example only, the spirit and scope of the invention being limited solely by the appended claims and their equivalents.

REFERENCES

1) Stiff, H. A. and Davis, L. E. "Method for Predicting the Tendency of Oilfield Waters to Deposit Calcium Carbonate," Trans., AIME (1952) 195, 213-216
2) Oddo, J. E. and Tomson, M. B. "Why Scale Forms and How To Predict it" SPE Production & Facilities, February, 1994, 47-54
3) Oddo, J. E. and M. B. Tomson "Simplified Calculation of $CaCO_3$ Saturation at High Temperature and Pressures in Brine Solutions," Journal of Petroleum Technology (1982) July, 1583-1590
4) Haarberg, T, Delm, I, Granbakken, D. B, Read, P, and Schmidt, T, "Scale Formation in Reservoir and Production Equipment During Oil Recovery: An Equilibrium Model" SPE Production Engineering (1992), February, 75-84
5) Straub, F. G, "Solubility of Calcium Sulfate and Calcium Carbonate at Temperatures between 182 C to 316 C" Industrial and Engineering Chemistry, V(24), No. 8, August, (1932) 914-917
6) Yeboah, Y. D., Someh, S. K., and Saeed, M. R. "A New and Reliable Model for Predicting Oilfield Scale Formation," SPE 25166, (1993) 167-176

What is claimed is:

1. A method of constructing a well tool, the method comprising:
    a) determining velocities of fluid flow at a predetermined offset from surfaces of a geometric model representative of the well tool;
    b) calculating scale buildup on the surfaces based at least in part on the determined velocities, the calculating being performed by a computing system comprising at least one processor;
    c) reducing pressure change per unit distance along selected ones of the surfaces having greater than a predetermined level of calculated scale buildup by modifying the geometric model; and
    d) repeating steps a-c until all scale buildup calculated in step b is no greater than the predetermined level;
    further comprising using steps a-d to design a geometry of the well tool surfaces, thereby minimizing the scale buildup.

2. The method of claim 1, wherein the method further comprises constructing the well tool having the well tool surfaces geometry.

3. The method of claim 1, wherein the reducing further comprises reducing the velocities corresponding to the selected ones of the surfaces.

4. The method of claim 1, wherein the determining further comprises determining a pressure min the well tool, the well tool comprising an internal longitudinal flow passage.

5. The method of claim 4, wherein the determining a pressure comprises a change per unit distance along the surfaces of the geometric model representative of well tool.

6. The method of claim 5, wherein the calculating further comprises inputting the pressure change per unit distance along the surfaces to the mathematical model which calculates the scale buildup.

7. A method of constructing a well tool, the method comprising:
    a) determining velocities of fluid flow at a predetermined offset from surfaces of a geometric model representative of the well tool;
    b) calculating scale buildup on the surfaces based at least in part on the determined velocities, the calculating is performed by a computing system comprising at least one processor;
    c) modifying the geometric to reduce pressure change per unit distance along selected ones of the surfaces having greater than a predetermined level of calculated scale buildup;
    d) repeating steps a-c until all scale buildup calculated in step b is no greater than the predetermined level; and e) constructing a well tool to allow all the scale buildup to be no greater than the predetermined level.

8. The method of claim 7, wherein the method further comprises using steps a-d to design a geometry of the well tool surfaces, thereby minimizing the scale buildup.

9. The method of claim 8, wherein the method further comprises constructing the well tool having the well tool surfaces geometry.

10. The method of claim 7, wherein the reducing further comprises reducing the velocities corresponding to the selected ones of the surfaces.

11. The method of claim 7, wherein the calculating further comprises inputting the velocities to a mathematical model which calculates the scale buildup.

* * * * *